United States Patent
Shiota et al.

(10) Patent No.: US 8,450,753 B2
(45) Date of Patent: May 28, 2013

(54) BOARD MODULE AND METHOD OF MANUFACTURING SAME

(75) Inventors: Motoji Shiota, Osaka (JP); Gen Nagaoka, Osaka (JP); Ichiro Umekawa, Osaka (JP); Yasuhiro Hida, Osaka (JP); Yukio Shimizu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 120 days.

(21) Appl. No.: 13/063,983

(22) PCT Filed: Jun. 2, 2009

(86) PCT No.: PCT/JP2009/060092
§ 371 (c)(1),
(2), (4) Date: Mar. 15, 2011

(87) PCT Pub. No.: WO2010/035551
PCT Pub. Date: Apr. 1, 2010

(65) Prior Publication Data
US 2011/0169022 A1    Jul. 14, 2011

(30) Foreign Application Priority Data
Sep. 29, 2008  (JP) ................................. 2008-251554

(51) Int. Cl.
*H01L 29/18* (2006.01)

(52) U.S. Cl.
USPC ................. 257/88; 257/678; 257/E23.055

(58) Field of Classification Search
CPC .................................................. H01L 25/0753
USPC .................. 257/88, 678–684, 723, 724, 725, 257/726, 728, 783, 787, 778–795, E23.055, 257/E23.065, E23.112, E23.027, E23.166, 257/E21.514
See application file for complete search history.

(56) References Cited

U.S. PATENT DOCUMENTS 5,688,584 A * 11/1997 Casson et al. ................. 428/209
7,139,060 B2 * 11/2006 Cheng et al. .................. 349/150
(Continued)

FOREIGN PATENT DOCUMENTS

CN    1317827 A    10/2001
JP    05-313178 A    11/1993
(Continued)

OTHER PUBLICATIONS

Official Communication issued in International Patent Application No. PCT/JP2009/060092, mailed on Jul. 21, 2009.

*Primary Examiner* — Cuong Q Nguyen
*Assistant Examiner* — Yosef Gebreyesus
(74) *Attorney, Agent, or Firm* — Keating & Bennett, LLP

(57) ABSTRACT

A liquid crystal display device (100) includes a glass substrate (110) having an LSI chip (130) and an FPC board (140) mounted thereon. A component ACF (150a) made of a single sheet is used to further mount discrete electronic components such as stabilizing capacitors (150) on the glass substrate (110). The component ACF (150a) has a size that covers not only a region where the discrete electronic components are to be mounted, but also the top surfaces of the LSI chip (130) and the FPC board (140) which are mounted first. By thus using the large component ACF (150a), a positional constraint upon adhering the component ACF (150a) to the glass substrate (110) is eliminated, reducing the area of a region where the discrete electronic components are mounted. By this, a board module miniaturized by reducing the area of a region where discrete electronic components are mounted is provided.

13 Claims, 9 Drawing Sheets

U.S. PATENT DOCUMENTS

| | | | |
|---|---|---|---|
| 7,935,892 B2 * | 5/2011 | Nishikawa et al. | 174/260 |
| 2001/0050431 A1 | 12/2001 | Naitoh et al. | |
| 2003/0146371 A1 | 8/2003 | Gudesen et al. | |
| 2007/0002254 A1 | 1/2007 | Ogawa et al. | |
| 2007/0227671 A1 | 10/2007 | Chen | |
| 2010/0220072 A1 * | 9/2010 | Chien et al. | 345/173 |
| 2011/0122337 A1 * | 5/2011 | Shimizu et al. | 349/61 |
| 2011/0169791 A1 * | 7/2011 | Hida et al. | 345/204 |
| 2011/0169792 A1 * | 7/2011 | Shimizu et al. | 345/204 |
| 2012/0182697 A1 * | 7/2012 | Nagaoka et al. | 361/728 |

FOREIGN PATENT DOCUMENTS

| | | | |
|---|---|---|---|
| JP | 09-101533 A | | 4/1997 |
| JP | 2000-068633 A | | 3/2000 |
| JP | 2000-332373 A | | 11/2000 |
| JP | 2006235295 A | * | 9/2006 |
| JP | 2007-156288 A | | 6/2007 |
| RU | 2272336 C2 | | 3/2006 |
| WO | 2008/102476 A1 | | 8/2008 |

* cited by examiner

CROSS SECTION A-A

CROSS SECTION B-B

CROSS SECTION C-C

CROSS SECTION D-D

CROSS SECTION E-E

CROSS SECTION F-F

CROSS SECTION G-G

CROSS SECTION H-H

BOARD MODULE AND METHOD OF MANUFACTURING SAME

TECHNICAL FIELD

The present invention relates to a board module and a method of manufacturing the board module, and more particularly to a board module including electronic components mounted using anisotropic conductive adhesives, and a method of manufacturing the board module.

BACKGROUND ART

FIG. 9 is a schematic plan view of a conventional liquid crystal display device 600 mounted on a mobile phone, etc. As shown in FIG. 9, the liquid crystal display device 600 includes two glass substrates 610 and 615 disposed to face each other, an LSI chip 630, an FPC board 640, a plurality of discrete electronic components 650 such as capacitors. In the following, a liquid crystal display device as used herein refers to one that includes two glass substrates disposed to face each other and an LSI chip, an FPC board, and electronic components, such as capacitors, which are mounted on the glass substrate, but does not include a backlight, a polarizing plate, etc.

A liquid crystal (not shown) is sealed in space sandwiched between the two glass substrates 610 and 615 by a sealing material (not shown), and a display portion 620 is formed on the glass substrate 615. In addition, on a projection 611 of the glass substrate 610 are mounted the Large Scale Integration (hereinafter referred to as "LSI") chip 630 having a driver function required to drive the display portion 620, the Flexible Printed Circuit (hereinafter referred to as "FPC") board 640 connected to an external electronic device, and the plurality of discrete electronic components 650, such as capacitors, required for the operation of the LSI chip 630. When a video signal, a control signal, and a supply voltage are provided to the LSI chip 630 from an external source through the FPC board 640, video is displayed on the display portion 620.

The LSI chip 630 and the FPC board 640 are mounted on the projection 611 using a chip Anisotropic Conductive Film (hereinafter, referred to as "ACF") 630a and an FPC ACF 640a, respectively. In addition, the plurality of discrete electronic components 650 are mounted on the projection 611 using component ACFs 650a, each of which is supplied to each group of discrete electronic components 650 which are in close proximity to each other. Therefore, a plurality of component ACFs 650a are required to mount the discrete electronic components 650 on the projection 611. Since the plurality of component ACFs 650a are continuously supplied to the projection 611, when the component ACFs 650a are supplied, component ACFs 650a adhered adjacent to each other may come into contact with each other or a component ACF 650a may come into contact with the LSI chip 630 or the FPC board 640 which is mounted first, resulting in the position of a supplied component ACF 650a being shifted from a position where the component ACF 650a is originally intended to be adhered.

To prevent the occurrence of such a shift, there is a need to sufficiently keep space between the adhering positions of adjacent component ACFs 650a. However, when the space between the adhering positions of adjacent component ACFs 650a is sufficiently kept, the area of the projection 611 increases, causing a problem that the frame of the liquid crystal display device 600 cannot be narrowed.

Hence, to solve this problem, Patent Document 1 describes a liquid crystal display device in which a single large ACF is adhered to a projection, and an LSI chip, an FPC board, and a plurality of discrete electronic components are all mounted on the projection using the ACF.

In addition, Patent Document 2 describes a liquid crystal display device in which on an LSI chip mounted on a glass substrate using an ACF there is further mounted an FPC board using an ACF, thereby reducing the area of a projection.

PRIOR ART DOCUMENTS

Patent Documents

[Patent Document 1] Japanese Patent Application Laid-Open No. 5-313178

[Patent Document 2] Japanese Patent Application Laid-Open No. 9-101533

SUMMARY OF THE INVENTION

Problems To Be Solved By the Invention

In the liquid crystal display device described in Patent Document 1, however, when an LSI chip, an FPC board, and electronic components are connected, despite the fact that characteristics required for an ACF differ therebetween, they are connected to traces formed in a projection, using a single ACF. Hence, if any of the LSI chip, the FPC board, and the discrete electronic components mounted on the projection is not suited to the characteristics of the ACF used, then various problems occur.

In addition, Patent Document 2 does not describe nor suggest the relationship between an ACF for connecting an LSI chip and an ACF for connecting an FPC board. Therefore, when the ACFs are of the same type, the same problems as those of the liquid crystal display device described in Patent Document 1 occur.

An object of the present invention is therefore to provide a board module in which, while considering the connection characteristics between a plurality of electronic components to be mounted and ACFs, a constraint on ACF adhering position is eliminated, thereby reducing the area of a region where the electronic components are mounted and achieving miniaturization of the board module, and a method of manufacturing the board module.

Means For Solving the Problems

According to a first aspect of the present invention, there is provided a board module having a plurality of electronic components mounted on a substrate by anisotropic conductive adhesives, the board module comprising:

a substrate having a first, a second, and a third region;

a first and a third anisotropic conductive adhesive;

a first electronic component mounted in the first region by the first anisotropic conductive adhesive;

a second electronic component mounted in the second region; and a third electronic component mounted in the third region by the third anisotropic conductive adhesive, wherein the third anisotropic conductive adhesive is integrally formed and covers at least the first, second, and third regions.

According to a second aspect of the present invention, in the first aspect of the present invention, the third anisotropic conductive adhesive covers at least a top surface of the first electronic component, a top surface of the second electronic component, and the third region.

According to a third aspect of the present invention, in the first aspect of the present invention,
the third anisotropic conductive adhesive covers at least a top surface of the first electronic component, the second region, and the third region, and
the second electronic component and the third electronic component are mounted in the second region and the third region, respectively, by the third anisotropic conductive adhesive.

According to a fourth aspect of the present invention, in the third aspect of the present invention,
the board module further includes a second anisotropic conductive adhesive adhered to the second electronic component,
the second electronic component is mounted in the second region by the second anisotropic conductive adhesive and the third anisotropic conductive adhesive.

According to a fifth aspect of the present invention, in the second or third aspect of the present invention,
a Young's modulus of the first electronic component is higher than a Young's modulus of the second electronic component,
a storage elastic modulus of the first anisotropic conductive adhesive is higher than or equal to a storage elastic modulus of the second anisotropic conductive adhesive, and
tack strength of the first anisotropic conductive adhesive is lower than tack strength of the second anisotropic conductive adhesive.

According to a sixth aspect of the present invention, in the fifth aspect of the present invention,
the substrate is a rigid substrate, and
the storage elastic modulus of the first anisotropic conductive adhesive is 1.5 to 2.0 GPa, and the storage elastic modulus of the second anisotropic conductive adhesive is 1.2 to 1.3 GPa.

According to a seventh aspect of the present invention, in the fifth aspect of the present invention, a size of conductive particles respectively contained in the first, second, and third anisotropic conductive adhesives increases in order of the first, second, and third anisotropic conductive adhesives, and a pitch of terminals respectively provided on the first, second, and third electronic components increases in order of the first, second, and third electronic components.

According to a eighth aspect of the present invention, in the second or third aspect of the present invention,
a Young's modulus of the first electronic component is higher than a Young's modulus of the third electronic component,
a storage elastic modulus of the first anisotropic conductive adhesive is higher than or equal to a storage elastic modulus of the third anisotropic conductive adhesive, and
tack strength of the third anisotropic conductive adhesive is higher than tack strength of the first anisotropic conductive adhesive.

According to a ninth aspect of the present invention, in the eighth aspect of the present invention, conductive particles contained in the third anisotropic conductive adhesive are larger than conductive particles contained in the first anisotropic conductive adhesive, and a pitch of terminals provided on the third electronic component is larger than a pitch of terminals provided on the first electronic component.

According to a tenth aspect of the present invention, in the first aspect of the present invention, the third anisotropic conductive adhesive has an opening at least in a portion thereof corresponding to a top surface of the first electronic component.

According to an eleventh aspect of the present invention, in the first aspect of the present invention,
the substrate is a rigid substrate having a trace formed on a surface thereof,
the first electronic component is a semiconductor chip having a bump electrode formed on a surface of a semiconductor substrate, and
the semiconductor chip is mounted by connecting the bump electrode to the trace on the rigid substrate.

According to a twelfth aspect of the present invention, in the first aspect of the present invention,
the substrate is a flexible substrate having a trace formed on a surface thereof,
the first electronic component is a semiconductor chip having a bump electrode formed on a surface of a semiconductor substrate, and
the semiconductor chip is mounted by connecting the bump electrode to the trace on the flexible substrate.

According to a thirteenth aspect of the present invention, in the first aspect of the present invention,
the first electronic component is a semiconductor element formed on a semiconductor substrate,
the second electronic component is a flexible printed circuit board, and
the third electronic component is a discrete electronic component.

According to a fourteenth aspect of the present invention which comprises the board module of the thirteenth aspect of the present invention, the board module further includes a display portion formed on the substrate, and
the semiconductor element is a drive element that drives the display portion based on a signal provided from an external source through the flexible printed circuit board.

According to a fifteenth aspect of the present invention, there is provided a method of manufacturing a board module having a plurality of electronic components mounted on a substrate by anisotropic conductive adhesives, the method comprising:
a preparing step of preparing a substrate having a first, a second, and a third region where electronic components are to be mounted;
a first mounting step of mounting a first electronic component in the first region using a first anisotropic conductive adhesive;
a second mounting step of mounting a second electronic component in the second region;
a first adhering step of supplying, at least after the first mounting step, an integrally formed third anisotropic conductive adhesive so as to cover a top surface of the first electronic component and the second and third regions, and applying pressure to a surface of the third anisotropic conductive adhesive using an elastic member, thereby adhering the third anisotropic conductive adhesive; and
a third mounting step of mounting a third electronic component in the third region using the adhered third anisotropic conductive adhesive.

According to a sixteenth aspect of the present invention, in the fifteenth aspect of the present invention,
the second mounting step includes a first thermocompression bonding step of thermocompression bonding the second electronic component to the second region using a second anisotropic conductive adhesive, and the third mounting step includes:
- a second adhering step of adhering the third anisotropic conductive adhesive onto the substrate so as to cover at least the top surface of the mounted first electronic component, a top surface of the mounted second electronic component, and the third region;
- a temporarily placing step of temporarily placing the third electronic component on the third anisotropic conductive adhesive supplied to the third region; and
- a second thermocompression bonding step of thermocompression bonding the third electronic component to the third region by the third anisotropic conductive adhesive.

According to a seventeenth aspect of the present invention, in the fifteenth aspect of the present invention,
the third mounting step includes:
- a second adhering step of adhering the third anisotropic conductive adhesive onto the substrate so as to cover at least the top surface of the mounted first electronic component, the second region, and the third region;
- a first temporarily placing step of temporarily placing the second electronic component on the third anisotropic conductive adhesive supplied to the second region;
- a second temporarily placing step of temporarily placing the third electronic component on the third anisotropic conductive adhesive supplied to the third region; and
- a thermocompression bonding step of thermocompression bonding the second electronic component to the second region by the third anisotropic conductive adhesive and, at the same time, thermocompression bonding the third electronic component to the third region by the third anisotropic conductive adhesive.

According to an eighteenth aspect of the present invention, in the sixteenth or seventeenth aspect of the present invention,
the second adhering step further includes:
- a pressure bonding step of pressure bonding an adhesive member onto at least a portion of the third anisotropic conductive adhesive adhered to the top surface of the first electronic component; and
- a peeling step of peeling the pressure-bonded adhesive member.

According to a nineteenth aspect of the present invention, in the fifteenth aspect of the present invention,
the second mounting step includes a second adhering step of adhering a second anisotropic conductive adhesive to the second electronic component, and
the third mounting step includes:
- a third adhering step of adhering the third anisotropic conductive adhesive onto the substrate so as to cover at least the top surface of the mounted first electronic component, the second region, and the third region;
- a first temporarily placing step of temporarily placing the second electronic component having the second anisotropic conductive adhesive adhered thereto, on the third anisotropic conductive adhesive supplied to the second region;
- a second temporarily placing step of temporarily placing the third electronic component on the third anisotropic conductive adhesive supplied to the third region; and
- a thermocompression bonding step of thermocompression bonding the second electronic component having the second anisotropic conductive adhesive adhered thereto, to the second region by the third anisotropic conductive adhesive and, at the same time, thermocompression bonding the third electronic component to the third region by the third anisotropic conductive adhesive.

According to a twentieth aspect of the present invention, in the nineteenth aspect of the present invention,
the third adhering step further includes:
- a pressure bonding step of pressure bonding an adhesive member onto at least a portion of the third anisotropic conductive adhesive adhered to the top surface of the first electronic component; and
- a peeling step of peeling the pressure-bonded adhesive member.

Effect of the Invention

According to the first or fifteenth aspect of the present invention, the third anisotropic conductive adhesive used when mounting the third electronic component in the third region of the substrate is integrally formed, and has a size that not only covers the third region but also covers the first and second regions. Therefore, when the third anisotropic conductive adhesive is adhered, a constraint on adhering position is eliminated, and thus, the area of the substrate on which the first, second, and third electronic components are mounted can be reduced. In addition, when the area of the substrate is reduced, the number of substrates taken from a single mother glass increases, and thus, the manufacturing cost of a board module can be reduced. In addition, since the third anisotropic conductive adhesive is adhered to the substrate with the entire third anisotropic conductive adhesive being held down by the elastic member, even if the substrate has bumps and dips which are formed by the first electronic component, etc., mounted first, the third anisotropic conductive adhesive can be adhered neatly along the surface of the substrate with bumps and dips.

According to the second or sixteenth aspect of the present invention, the third anisotropic conductive adhesive is adhered so as to cover the top surfaces of the first and second electronic components which are mounted first, and the third electronic component is mounted by the third anisotropic conductive adhesive. Hence, when the third anisotropic conductive adhesive is adhered, a constraint on adhering position is eliminated, and thus, the area of the substrate on which the first, second, and third electronic components are mounted can be reduced.

According to the third or seventeenth aspect of the present invention, after the third anisotropic conductive adhesive is adhered to the second and third regions of the substrate, the second and third electronic components are simultaneously mounted in the second and third regions, respectively, by the third anisotropic conductive adhesive. As such, since the second electronic component and the third electronic component are simultaneously mounted on the substrate, the manufacturing process of the board module can be shortened. In addition, the second electronic component is also mounted by the third anisotropic conductive adhesive and thus a second anisotropic conductive adhesive does not need to be used. Accordingly, the manufacturing cost can be reduced.

According to the fourth or nineteenth aspect of the present invention, after the third anisotropic conductive adhesive is adhered to the second and third regions of the substrate, the second electronic component having the second anisotropic conductive adhesive adhered thereto and the third electronic component are simultaneously mounted in the second and third regions, respectively, by the third anisotropic conductive adhesive. As such, since the second electronic component and the third electronic component are simultaneously mounted on the substrate, the manufacturing process of the board module can be shortened. In addition, for the second anisotropic conductive adhesive adhered to the second electronic component, an optimum anisotropic conductive adhesive can be selected.

According to the fifth aspect of the present invention, since the Young's modulus of the first electronic component is higher than the Young's modulus of the second electronic component, the first electronic component is mounted on the substrate using an anisotropic conductive adhesive with a higher storage elastic modulus than the second electronic component. As a result, the stress applied to a portion of the anisotropic conductive adhesive at a connected portion between the first electronic component and the substrate can be reduced, enabling to ensure the reliability of each connected portion. In addition, since the tack strength of the second anisotropic conductive adhesive is higher than the tack strength of the first anisotropic conductive adhesive, the second electronic component can be temporarily placed on the second anisotropic conductive adhesive with a weaker force than the first electronic component.

According to the sixth aspect of the present invention, when the substrate is a rigid substrate, for the first anisotropic conductive adhesive one with a storage elastic modulus of 1.5 to 2.0 GPa is used, and for the second anisotropic conductive adhesive one with a storage elastic modulus of 1.2 to 1.3 GPa is used. As a result, the rigid substrate has the same effects as in the fifth aspect.

According to the seventh aspect of the present invention, the size of conductive particles contained in the first, second, and third anisotropic conductive adhesives increases in the order of the first, second, and third anisotropic conductive adhesives. In addition, the pitch of terminals provided on the first, second, and third electronic components increases in the order of the first, second, and third electronic components. Hence, by connecting the terminals of the first, second, and third electronic components by the first, second, and third anisotropic conductive adhesives, respectively, the terminals of all of the electronic components can be prevented from being short-circuited due to conductive particles.

According to the eighth aspect of the present invention, for the third anisotropic conductive adhesive, by selecting one with higher tack strength than the first anisotropic conductive adhesive, the third electronic component is temporarily placed being securely fixed on the third anisotropic conductive adhesive. Thus, the third electronic component is reliably connected to the third region without its position moving until the third electronic component is permanently pressure bonded. In particular, when there are a large number of third electronic components mounted on the substrate, a high-speed mounter is used for temporary placement, and thus, an anisotropic conductive adhesive with strong tack strength is more effective. In addition, the first anisotropic conductive adhesive with a high storage elastic modulus is used to mount the first electronic component with a high Young's modulus, and the third anisotropic conductive adhesive with a lower storage elastic modulus than the first anisotropic conductive adhesive is used to mount the third electronic component with a lower Young's modulus than the first electronic component. As such, since an anisotropic conductive adhesive with an optimum storage elastic modulus according to the Young's modulus of an electronic component is used, the reliability of a connected portion is also ensured.

According to the ninth aspect of the present invention, the conductive particles contained in the third anisotropic conductive adhesive are larger than the conductive particles contained in the first anisotropic conductive adhesive, and the pitch of the terminals provided on the third electronic component is larger than the pitch of the terminals provided on the first electronic component. Hence, by connecting the terminals of the third electronic component by the third anisotropic conductive adhesive, and connecting the terminals of the first electronic component by the first anisotropic conductive adhesive, the terminals of all of the electronic components can be prevented from being short-circuited due to conductive particles.

According to the tenth, eighteenth, or twentieth aspect of the present invention, since the third anisotropic conductive adhesive has an opening at least in a portion thereof corresponding to the top surface of the first electronic component, the heat dissipation efficiency of the first electronic component can be increased.

According to the eleventh aspect of the present invention, by connecting the bump electrode of the semiconductor chip to the trace formed on the rigid substrate, the mounting area of the semiconductor chip is reduced, enabling to miniaturize the rigid substrate. In addition, by using, as the rigid substrate, a transparent substrate such as a glass substrate, the board module can be used in a display device such as a liquid crystal display device.

According to the twelfth aspect of the present invention, by connecting the bump electrode of the semiconductor chip to the trace formed on the flexible substrate, the mounting area of the semiconductor chip is reduced, enabling to miniaturize the flexible substrate. In addition, by mounting such a flexible substrate on an electronic device, the electronic device can be miniaturized.

According to the thirteenth aspect of the present invention, the board module on which a semiconductor element such as an LSI chip is mounted as the first electronic component, a flexible printed circuit board is mounted as the second electronic component, and a discrete electronic component such as a chip capacitor is mounted as the third electronic component has the same effects as in the first aspect.

According to the fourteenth aspect of the present invention, in the display device including the board module that displays video based on a signal provided from an external source through the flexible printed circuit board, the space between the first, second, and third regions can be narrowed. Hence, the frame of the display device can be narrowed.

MODE FOR CARRYING OUT THE INVENTION

<1. Basic Considerations>

Figure 1A:
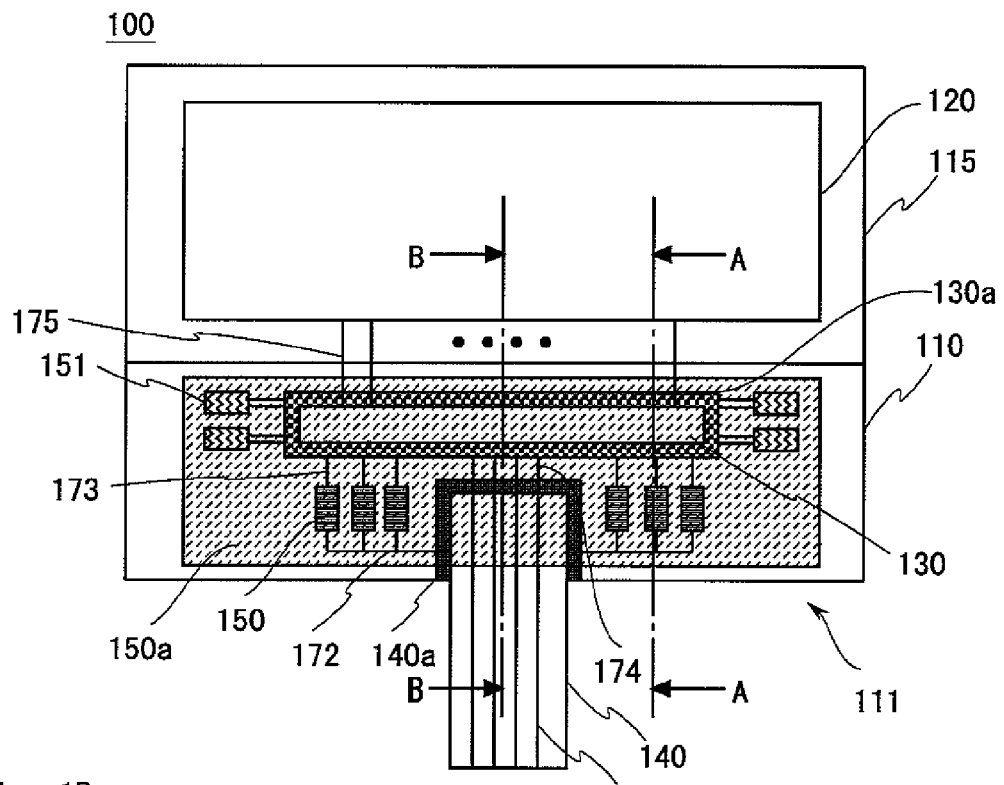
FIG. 1A is a schematic plan view showing a configuration of a liquid crystal display device according to a first embodiment of the present invention.

When an LSI chip, an FPC board, and discrete electronic components such as capacitors are connected by ACFs to traces formed on a glass substrate, unless ACFs to be used are appropriate, various problems occur. The characteristics required for ACFs used when an LSI chip, an FPC board, and discrete electronic components are mounted on a projection of a glass substrate are: the size of conductive particles contained, storage elastic modulus, and tack strength. The three characteristics of ACFs are considered below in turn.

First, the size of conductive particles contained in ACFs is considered. The relationship between the pitches (distances) of terminals provided on the LSI chip and the discrete electronic components and the pitch of trace layers formed on the FPC board is shown in the following expression (1):

LSI chip<FPC<discrete electronic components    (1).

As can be seen from expression (1), the LSI chip which achieves a fine pitch along with an increase in the number of pixels in a display portion and a reduction in chip size has the smallest terminal pitch. On the other hand, the discrete electronic components have two terminals and thus have the largest terminal pitch. In addition, the pitch of the trace layers formed on the FPC board is an intermediate pitch between the terminal pitch of the LSI chip and the terminal pitch of the discrete electronic components.

When each of the terminals of the LSI chip, the FPC board, and the discrete electronic components is connected to traces using ACFs, pressure is applied onto electronic components such as the LSI chip for a predetermined period of time while heating the ACFs. At this time, pressure is applied to the ACFs sandwiched between the terminals of the LSI chip, the FPC board, and the discrete electronic components and the traces formed in the projection. Within the ACFs to which the pressure is applied, dispersed conductive particles overlap each other while coming into contact with each other, thereby forming conductive paths. By the formed conductive paths, the terminals of the LSI chip, the FPC board, and the discrete electronic components are connected to the traces formed on the glass substrate, respectively. Since the ACFs contain a thermosetting resin, even if the application of pressure is stopped, the formed conductive paths do not disappear. At this time, since pressure is not applied within planes, conductive paths are not formed within the planes, and thus, the insulating properties within the planes of the ACFs are maintained. Note that, in place of an ACF, instead of the film form like an ACF, an anisotropic conductive paste in which conductive particles are mixed in a paste-like thermosetting resin may be used.

Hence, as used herein, an anisotropic conductive film and an anisotropic conductive paste are collectively referred to as an anisotropic conductive adhesive.

The thickness of a conductive path to be formed depends on the size of conductive particles, and the larger the conductive particles, the thicker the conductive path. However, when conductive particles are too large, the conductive particles simultaneously come into contact with adjacent terminals, causing a problem that the adjacent terminals are short-circuited.

In view of this, when selecting an optimum ACF according to the size of conductive particles, the relationship with the terminal pitches of the LSI chip, etc., becomes important. If small-pitch terminals such as those of the LSI chip are connected by an ACF containing large conductive particles, then the conductive particles may simultaneously come into contact with both of adjacent terminals, causing a short circuit between the adjacent terminals. Hence, for the connection of the LSI chip, an ACF containing small conductive particles needs to be used so as to prevent the conductive particles from simultaneously coming into contact with both of adjacent terminals.

On the other hand, the terminal pitch of the discrete electronic components is considerably larger than that of the LSI chip. Thus, even if the terminals of the discrete electronic components are connected to traces using an ACF containing large conductive particles, adjacent terminals are not short-circuited. Note that, when the terminals of the discrete electronic components are connected to the traces, even if an ACF containing small conductive particles such as that used for the connection of the LSI chip is used, the terminals of the discrete electronic components are connected to the traces without causing a short circuit. As such, for the discrete electronic components with a large terminal pitch, an ACF can be selected without a constraint on the size of conductive particles.

In addition, the pitch of the trace layers on the FPC board is an intermediate pitch between the terminal pitch of the LSI chip and the terminal pitch of the discrete electronic components. Thus, an FPC ACF contains conductive particles of an intermediate size between the sizes of conductive particles contained in a chip ACF and a component ACF. Note that the size of conductive particles contained in the FPC ACF may be any as long as the size is smaller than the pitch of the trace layers on the FPC board, and thus, maybe the same as that of, for example, conductive particles contained in the chip ACF.

As such, the chip ACF, the component ACF, and the FPC ACF contain conductive particles of any size smaller than the pitch of the terminals provided on the LSI chip, the pitch of the terminals provided on the discrete electronic components, and the pitch of the trace layers formed on the FPC board, respectively.

Next, the storage elastic modulus is considered. In ACFs, in general, a storage elastic modulus is often used which is determined by a dynamic viscoelasticity test where a cyclic stress is applied, and which indicates an elastic element of an ACF instead of a Young's modulus (after curing). Hence, in this specification, too, an elastic element of an ACF is evaluated by a storage elastic modulus. Note that a storage elastic modulus is determined by a dynamic viscoelasticity test, using a solid viscoelasticity measuring apparatus RSA-2 manufactured by Rheometrics, Inc., with measurement frequencies being 0.0016 to 16 Hz.

The LSI chip has a high Young's modulus and thus is difficult to be deformed (hereinafter, referred to as "stiff"). The FPC board has a low Young's modulus and thus is easy to be deformed (hereinafter, referred to as "soft"). In addition, the magnitude of the Young's modulus of the discrete electronic components is an intermediate value between the Young's moduli of the LSI chip and the FPC board, and thus, ease of deformation of the discrete electronic components is also intermediate therebetween. A glass substrate on which the LSI chip, the FPC board, and the discrete electronic components are mounted has a high Young's modulus and thus is stiff. Hence, when the LSI chip, the FPC board, or the discrete electronic components is(are respectively) connected to the stiff glass substrate, the reliability of a connected portion therebetween changes according to the relationship between the stiffness of the glass substrate and the stiffness of an electronic component such as the LSI chip.

When electronic components such as the LSI chip are mounted on the glass substrate using ACFs, respectively, stress is concentrated on the ACFs. In order to prevent the connected portions from being damaged by such stress, there is a need to mount a stiff electronic component using a stiff ACF and to mount a soft electronic component using a soft ACF.

Of the LSI chip, the FPC board, and the discrete electronic components, the LSI chip is stiffest and the FPC board is softest. In addition, the stiffness of the discrete electronic components is intermediate therebetween. On the other hand, for the stiffness of an ACF, the higher the storage elastic modulus, the stiffer the ACF. Thus, the storage elastic moduli of optimum ACFs for connecting the LSI chip, the FPC board, and the discrete electronic components to the glass substrate need to satisfy the following expression (2):

$$\text{chip ACF} \geqq \text{component ACF} \geqq \text{FPC ACF} \tag{2}$$

As can be seen from expression (2), the chip ACF has the highest storage elastic modulus, the FPC ACF has the lowest storage elastic modulus, and the component ACF has an intermediate storage elastic modulus therebetween. Specifically, for example, the storage elastic modulus of the chip ACF is 1.5 to 2.0 GPa and the storage elastic modulus of the FPC ACF is 1.2 to 1.3 GPa.

The component ACF can be used instead of the chip ACF to connect the LSI chip to the glass substrate, or can be used instead of the FPC ACF to connect the FPC board to the glass substrate.

Next, the tack strength is considered. The tack strength is a numerical representation of the "stickiness (tackiness)" of a pre-cured ACF, and is represented by the force required to pull away a probe being in contact with an adhesive surface, in a vertical direction. Thus, an ACF with high tack strength provides high temporary fixing strength when an electronic component such as the LSI chip is temporarily pressure bonded to a pre-cured ACF. When the tack strength is low, the temporary fixing strength is also low.

Since the number of the discrete electronic components to be mounted is large, the discrete electronic components are temporarily placed on a pre-cured component ACF by a high-speed mounter. Since the discrete electronic components are temporarily placed at high speed, the pressure applied to the discrete electronic components is low. Hence, when the discrete electronic components are temporarily placed on a pre-cured component ACF by a high-speed mounter, even if the pressure to be applied is low, the components need to be fixed on the component ACF so that the positions of the discrete electronic components do not change until they are permanently pressure bonded (thermocompression bonded). Due to this, the component ACF requires high tack strength.

On the other hand, when the LSI chip is temporarily placed on a pre-cured chip ACF, since high pressure is applied to the LSI chip upon the temporary placement, the LSI chip is fixed on the chip ACF more securely than the discrete electronic components. Thus, the tack strength of the chip ACF may be weaker than the tack strength of the component ACF.

In addition, when the FPC board is temporarily placed on a pre-cured FPC ACF, the pressure applied upon the temporary placement is an intermediate pressure between that for the discrete electronic components and that for the LSI chip. Thus, the tack strength of the FPC ACF may also be intermediate tack strength between that of the component ACF and that of the chip ACF.

Note that, considering only the tack strength, instead of the chip ACF and the FPC ACF, the component ACF having higher tack strength than the chip ACF and the FPC ACF can also be selected. However, it is known by experiment that the higher the storage elastic modulus of an ACF, the lower the tack strength, and the lower the storage elastic modulus, the higher the tack strength.

As a result, since, for the chip ACF required to mount the LSI chip, an ACF with a high storage elastic modulus needs to be used, the tack strength thereof is low. On the other hand, since the component ACF required to mount the discrete electronic components requires high tack strength, the storage elastic modulus thereof is lower than the storage elastic modulus of the chip ACF. In addition, since, for the FPC ACF required to mount the FPC board, an ACF with a low storage elastic modulus needs to be used, the tack strength thereof is higher than the tack strength of the chip ACF.

As a result of more in-depth consideration taking into account the storage elastic modulus, the tack strengths of the chip ACF, the FPC ACF, and the component ACF need to satisfy a relationship as shown in the following expression (3):

$$\text{chip ACF} < \text{FPC ACF} < \text{component ACF} \tag{3}$$

As such, ACFs used when the LSI chip, the FPC board, and the discrete electronic components are mounted on the glass substrate have different sizes of conductive particles contained, different storage elastic moduli before curing, and different tack strengths before curing. Hence, when attempting to connect the LSI chip, the FPC board, and the discrete electronic components to the glass substrate using one type of ACF, problems occur, e.g., a short circuit occurs between adjacent terminals; a connected portion is damaged by the long-term use; and due to insufficient fixation upon temporary placement, the position cannot be fixed until permanent pressure bonding is performed.

Hence, when the LSI chip, the FPC board, and the discrete electronic components are mounted on the glass substrate, optimum ACFs need to be selected taking into account the size of conductive particles contained, the storage elastic modulus before curing, and the tack strength before curing.

<2. First Embodiment>

2.1 Configuration of A Liquid Crystal Display Device

Figure 1B:
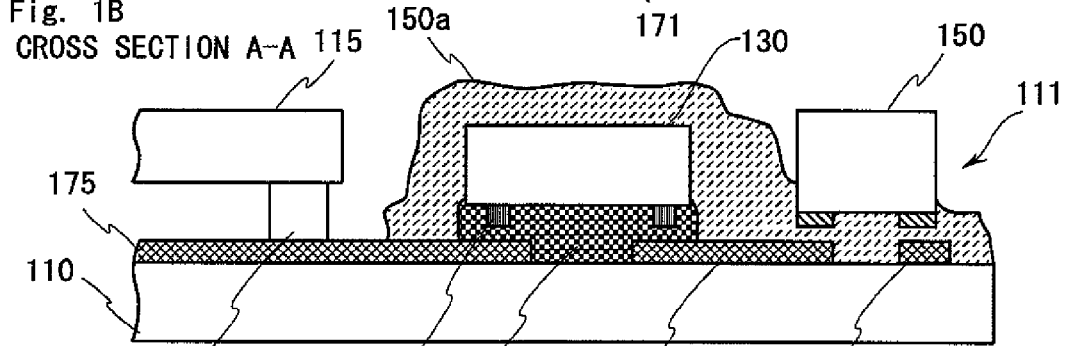
FIG. 1B is a cross-sectional view showing a cross section of the liquid crystal display device taking along line A-A in FIG. 1A.
Figure 1C:
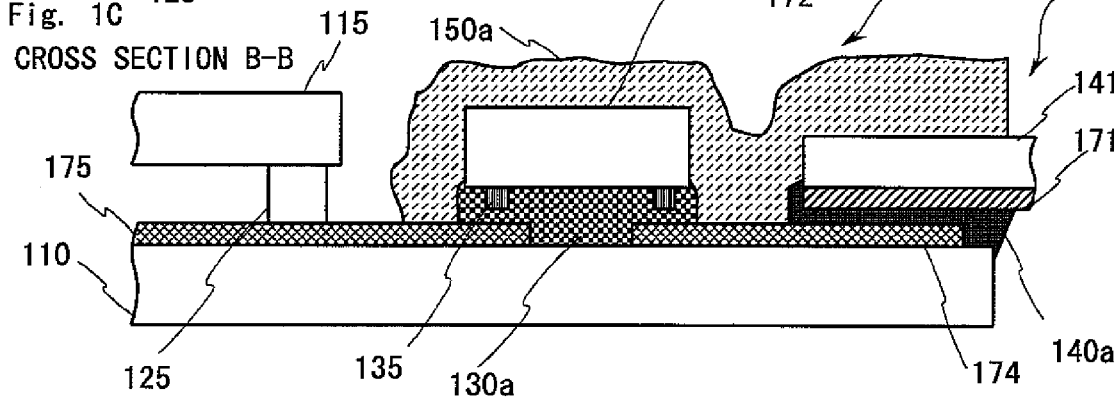
FIG. 1C is a cross-sectional view showing a cross section of the liquid crystal display device taking along line B-B in FIG. 1A.

FIG. 1A is a schematic plan view showing a configuration of a liquid crystal display device 100 according to a first embodiment of the present invention, FIG. 1B is a cross-sectional view showing a cross section of the liquid crystal display device 100 taking along line A-A in FIG. 1A, and FIG. 1C is a cross-sectional view showing a cross section of the liquid crystal display device 100 taking along line B-B in FIG. 1A. As shown in FIGS. 1A to 1C, the liquid crystal display device 100 includes two glass substrates 110 and 115 disposed to face each other, an LSI chip 130, an FPC board 140, six stabilizing capacitors 150, and four boost capacitors 151.

A liquid crystal (not shown) is sealed in space sandwiched between the two glass substrates 110 and 115 by a sealing material 125, and a display portion 120 is formed on the glass substrate 115. On a projection 111 of the glass substrate 110 are mounted the LSI chip 130 having a driver function required to drive the liquid crystal and a DC/DC converter function; the FPC board 140 that provides a video signal, a clock signal, etc., to the LSI chip 130 from an external electronic device; and the stabilizing capacitors 150 and the boost capacitors 151 which are required for the operation of the LSI chip 130.

The LSI chip 130 is a bare chip (a chip before packaging) that has circuit patterns of a gate driver, a source driver, and a DC/DC converter formed on a surface of a silicon substrate using a fine patterning technique, and that has bump electrode 135 with a height of about 15 μm formed as connection terminals for connecting the circuit patterns to an external source.

The FPC board 140 is a board having a plurality of trace layers 171 made of a copper (Cu) foil with a thickness of 8 to 50 μm and formed on one side of a flexible insulating film 141 with a thickness of 12 to 50 μm, and can be freely bended. Note that the trace layers 171 may be formed not only on one side of the insulating film 141 but also on both sides. The stabilizing capacitors 150 are capacitors that let noise superimposed on voltage generated in the LSI chip 130 out to grounding conductors 172. The boost capacitors 151 are capacitors used to boost voltage together with a boost circuit (charge pump circuit) included in the LSI chip 130. Each of the stabilizing capacitors 150 and the boost capacitors 151 is a ceramic chip capacitor with a size of 1.0 mm×0.5 mm.

On the glass substrate 110 are formed display traces 175 that connect the terminals of the LSI chip 130 to the display portion 120; component traces 173, each of which connects one terminal of a corresponding stabilizing capacitor 150 and both terminals of a corresponding boost capacitor 151 to a corresponding terminal of the LSI chip 130; the grounding conductors 172, each of which grounds the other terminal of a corresponding stabilizing capacitor 150; and FPC traces 174, each of which connects a corresponding trace layer 171 formed on the FPC board 140 to a corresponding terminal of the LSI chip 130. The traces 172 to 175 are simultaneously formed with traces in the display portion 120 and thus are formed of a material containing aluminum (Al) or tantalum (Ta).

The LSI chip 130 is connected, through the bump electrodes 135, to one ends of the display traces 175, one ends of the component traces 173, and one ends of the FPC traces 174 using a chip ACF 130a, with the frontside of the LSI chip 130 facing the glass substrate side. The trace layers 171 on the FPC board 140 are connected to the other ends of the FPC traces 174 using an FPC ACF 140a. The terminals of the stabilizing capacitors 150 and the boost capacitors 151 are connected to the other ends of the component traces 173 and the grounding conductors 172 using a component ACF 150a.

At this time, as shown in FIG. 1A, the chip ACF 130a is disposed only beneath the LSI chip 130, and the FPC ACF 140a is disposed only beneath the FPC board 140. However, the component ACF 150a is made of a single sheet and disposed to cover not only a region in the projection 111 where the stabilizing capacitors 150 and the boost capacitors 151 are to be mounted, but also the top surfaces of the LSI chip 130 and the FPC board 140 which are mounted on the projection 111 first. The stabilizing capacitors 150 and the boost capacitors 151 are connected to the component traces 173 and the grounding conductors 172 using the component ACF 150a.

2.2 Method of Manufacturing the Liquid Crystal Display Device

Figure 2A:
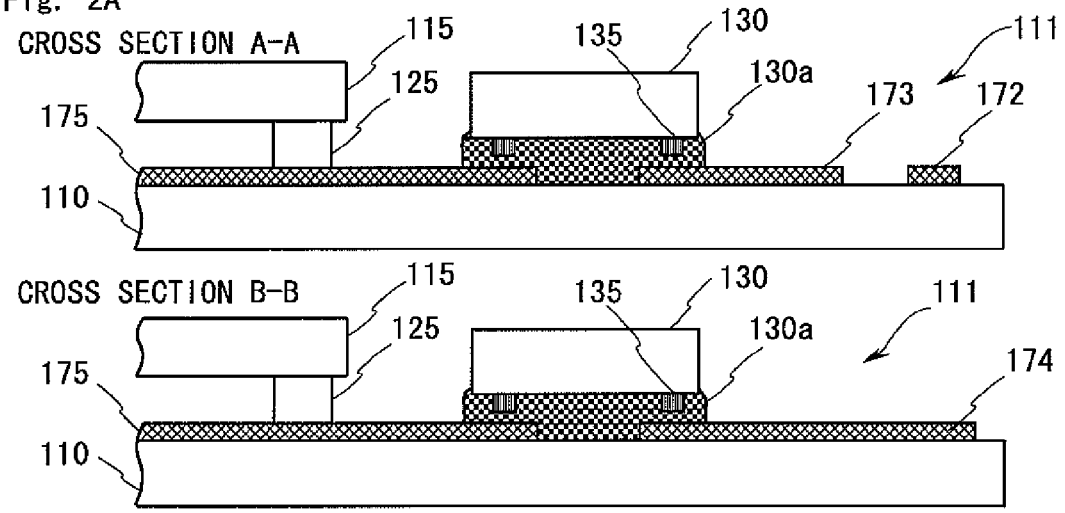
FIGS. 2A to 2C are cross-sectional views showing cross sections of the liquid crystal display device taking along line A-A and line B-B shown in FIG. 1A in a manufacturing process of the liquid crystal display device shown in FIGS. 1A to 1C.
Figure 2B:
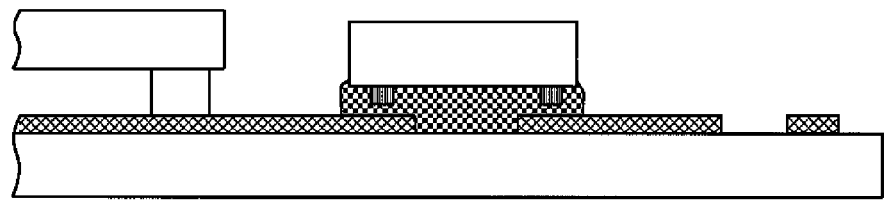
Figure 2B:
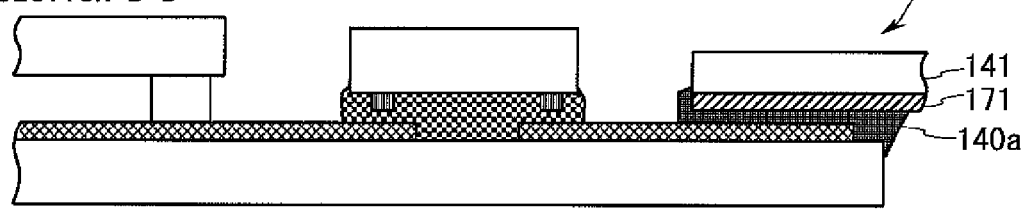
Figure 2C:
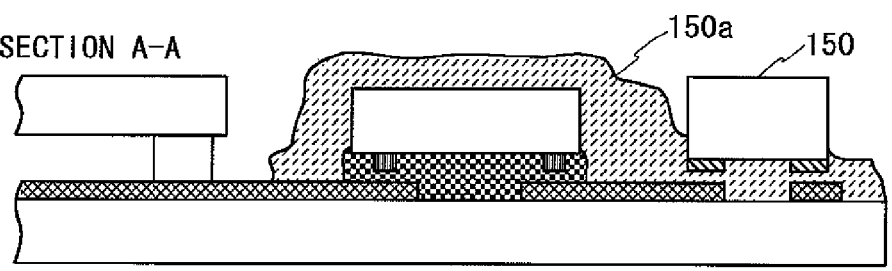
Figure 2C:
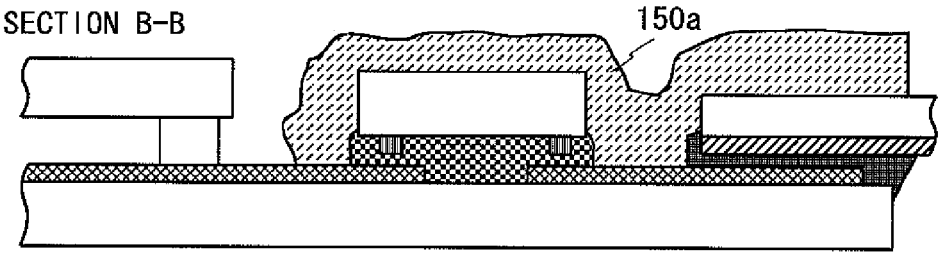

FIGS. 2A to 2C are cross-sectional views showing cross sections of the liquid crystal display device 100 taking along line A-A and line B-B shown in FIG. 1A in a manufacturing process of the liquid crystal display device 100 shown in FIGS. 1A to 1C.

First, as shown in FIG. 2A, a glass substrate 110 is prepared on which display traces 175, component traces 173, grounding conductors 172, and FPC traces 174 are formed in a projection 111. Then, a chip ACF 130a with the same size as an LSI chip 130 is supplied to a region in the projection 111 of the glass substrate 110 where the LSI chip 130 is to be mounted. Then, the supplied chip ACF 130a is adhered to the projection 111. The conditions for adhering the chip ACF 130a are, for example, a temperature of 60 to 100° C., a pressure bonding time of 1 to 5 seconds, and a pressure bonding pressure of 0.5 to 2 MPa.

Then, the LSI chip 130 with its frontside facing down is temporarily placed on the chip ACF 130a. At this time, alignment is performed such that bump electrodes 135 of the LSI chip 130 are connected to one ends of the display traces 175, one ends of the component traces 173, and one ends of the FPC traces 174, respectively. Then, the LSI chip 130 which is temporarily placed on the chip ACF 130a is permanently pressure bonded to the projection 111. The conditions for permanently pressure bonding the LSI chip 130 are, for example, a temperature of 180 to 220° C., a pressure bonding time of 5 to 15 seconds, and a pressure bonding pressure of 60 to 80 MPa.

In another step (not shown), an FPC ACF 140a with the same size as a region in the projection 111 where an FPC board 140 is to be mounted is adhered to the FPC board 140. The conditions for adhering the FPC ACF 140a are, for example, a temperature of 60 to 100° C., a pressure bonding time of 1 to 5 seconds, and a pressure bonding pressure of 0.5 to 2 MPa.

As shown in FIG. 2B, the FPC board 140 having the FPC ACF 140a adhered thereto is temporarily placed in the projection 111, with the FPC ACF 140a facing down. At this time, alignment is performed such that trace layers 171 on the FPC board 140 are connected to the other ends of the FPC traces 174. Then, the FPC board 140 which is temporarily placed is permanently pressure bonded to the projection 111. The conditions for permanently pressure bonding the FPC board 140 are, for example, a temperature of 160 to 190° C., a pressure bonding time of 10 to 20 seconds, and a pressure bonding pressure of 1.5 to 3.0 MPa.

As shown in FIG. 2C, a single component ACF 150a with a size that covers not only a region where stabilizing capacitors 150 and boost capacitors (not shown) are to be mounted, but also the top surfaces of the LSI chip 130 and the FPC board 140 which are mounted first, is supplied to the projection 111. Then, the supplied component ACF 150a is adhered. The conditions for adhering the component ACF 150a are, for example, a temperature of 60 to 100° C., a pressure bonding time of 1 to 5 seconds, and a pressure bonding pressure of 0.5 to 2 MPa. At this time, since the LSI chip 130 and the FPC board 140 are mounted first, bumps and dips are formed on a surface of the projection 111. Hence, by adhering the component ACF 150a with the entire component ACF 150a being held down by an elastic head, the component ACF 150a can be adhered neatly along the surface of the projection 111 with bumps and dips.

The stabilizing capacitors 150 and the boost capacitors are temporarily placed on the adhered component ACF 150a, using a high-speed mounter. At this time, alignment is performed such that one terminals of the stabilizing capacitors 150 are connected to the other ends of the component traces 173 and the other terminals to the grounding conductors 172, respectively, and both terminals of the boost capacitors are connected to the other ends of the different component traces 173, respectively. The conditions for the temporary placement are, for example, a pressure application time of 0.05 to 0.3 seconds and a pressure of 1.0 to 4.0 MPa, and the component ACF 150a is not heated.

Then, the stabilizing capacitors 150 and the boost capacitors which are temporarily placed on the component ACF 150a are permanently pressure bonded to the projection 111. The conditions for the permanent pressure bonding are, for example, a temperature of 180 to 200° C., a pressure bonding time of 10 to 20 seconds, and a pressure bonding pressure of 1.0 to 4.0 MPa. Note that even if the stabilizing capacitors 150 and the boost capacitors have different heights, by applying pressure to the top surfaces of the stabilizing capacitors 150 and the boost capacitors using an elastic head such as a rubber, pressures of substantially equal magnitude can be simultaneously applied to the stabilizing capacitors 150 and the boost capacitors (see, for example, Japanese Patent Application Laid-Open No. 2000-68633). As such, since the stabilizing capacitors 150 and the boost capacitors that have different heights are simultaneously connected to the component traces 173 and the grounding conductors 172 in the projection 111 by the same step, the manufacturing process of the liquid crystal display device 100 can be simplified.

In this manner, the liquid crystal display device 100 is manufactured in which the LSI chip 130 connected by the chip ACF 130a, the FPC board 140 connected by the FPC ACF 140a, and the stabilizing capacitors 150 and the boost capacitors which are connected by the component ACF 150a are mounted on the projection 111 of the glass substrate 110.

<2.3 Effects>

According to the liquid crystal display device 100 according to the first embodiment, first, the LSI chip 130 and the FPC board 140 are mounted on the projection 111 of the glass substrate 110 using the chip ACF 130a and the FPC ACF 140a, respectively. Then, the stabilizing capacitors 150 and the boost capacitors 151 are mounted using the component ACF 150a. Hence, the component ACF 150a can be made as a single sheet with a size that covers not only a region in the projection 111 where the stabilizing capacitors 150 and the boost capacitors 151 are mounted, but also the top surfaces of the LSI chip 130 and the FPC board 140 which are mounted on the projection 111 first.

In this case, when the component ACF 150a is supplied to the projection 111, there is no need to consider the positional relationship with another component ACF 150a and the LSI chip 130 and the FPC board 140 which are mounted first. Therefore, since a positional constraint upon adhering the component ACF 150a to the projection 111 is eliminated, the area of the projection 111 is reduced, enabling to narrow the frame of the liquid crystal display device 100.

In addition, when the LSI chip 130, the FPC board 140, the stabilizing capacitors 150, etc., are mounted on the glass substrate 110, optimum ACFs taking into account their characteristics can be selected. Furthermore, if the area of the projection 111 can be reduced, then the number of glass substrates 110 taken from a single mother glass increases. Thus, the manufacturing cost of the liquid crystal display device 100 can be reduced.

<3. Second Embodiment>

<3.1 Configuration of A Liquid Crystal Display Device>

Figure 3A:
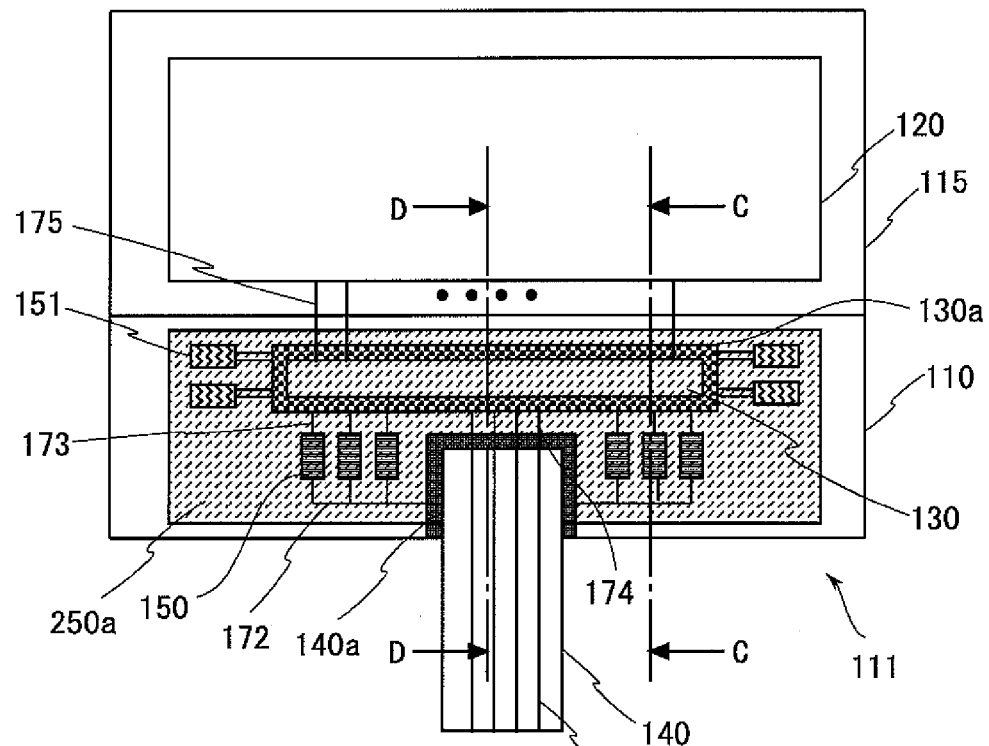
FIG. 3A is a schematic plan view showing a configuration of a liquid crystal display device according to a second embodiment of the present invention.
Figure 3B:
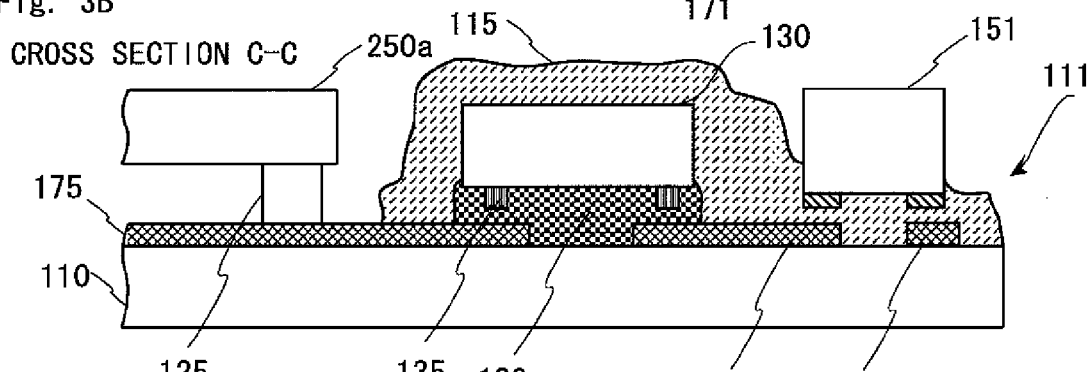
FIG. 3B is a cross-sectional view showing a cross section of the liquid crystal display device taking along line C-C in FIG. 3A.
Figure 3C:
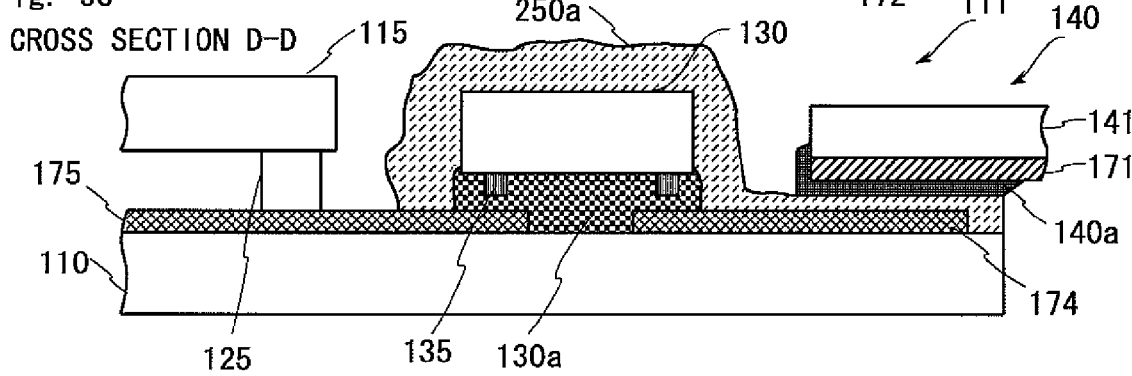
FIG. 3C is a cross-sectional view showing a cross section of the liquid crystal display device taking along line D-D in FIG. 3A.

FIG. 3A is a schematic plan view showing a configuration of a liquid crystal display device 200 according to a second embodiment of the present invention, FIG. 3B is a cross-sectional view showing a cross section of the liquid crystal display device 200 taking along line C-C in FIG. 3A, and FIG. 3C is a cross-sectional view showing a cross section of the liquid crystal display device 200 taking along line D-D in FIG. 3A. As shown in FIGS. 3A to 3C, the liquid crystal display device 200 includes two glass substrates 110 and 115 disposed to face each other, an LSI chip 130, an FPC board 140, six stabilizing capacitors 150, and four boost capacitors 151. In the liquid crystal display device 200, the same or corresponding components as/to those of a liquid crystal display device 100 according to the first embodiment are denoted by the same reference numerals, and differences from the liquid crystal display device 100 will be mainly described.

In the liquid crystal display device 200, a component ACF 250a is made of a single sheet and disposed to cover not only a region in a projection 111 where the stabilizing capacitors 150 and the boost capacitors 151 are to be mounted, but also the top surface of the LSI chip 130 mounted on the projection 111 first, and a region in the projection 111 where FPC board 140 is to be mounted. As such, in the liquid crystal display device 200, unlike the liquid crystal display device 100, the component ACF 250a is also formed in a region in the projection 111 where the FPC board 140 is to be mounted, instead of the top surface of the FPC board 140. Furthermore, the FPC board 140 is disposed on the component ACF 250a with an FPC ACF 140a being adhered to the FPC board 140, and is connected to the other ends of the FPC traces 174 by the FPC ACF 140a and the component ACF 250a.

In this case, as described in the basic considerations, the component ACF 250a can be used to connect the FPC board 140 to the projection 111 of the glass substrate 110. Hence, the reliability of a connected portion between the projection 111 and the FPC board 140 is sufficiently ensured even if the FPC ACF 140a and the component ACF 250a are interposed therebetween. Note that, since the FPC ACF 140a is directly adhered to the FPC board 140, even if the FPC board 140 is adhered to the projection 111 using the component ACF 250a, problems about the size of conductive particles and the tack strength do not occur.

<3.2 Method of Manufacturing the Liquid Crystal Display>Device

Figure 4A:
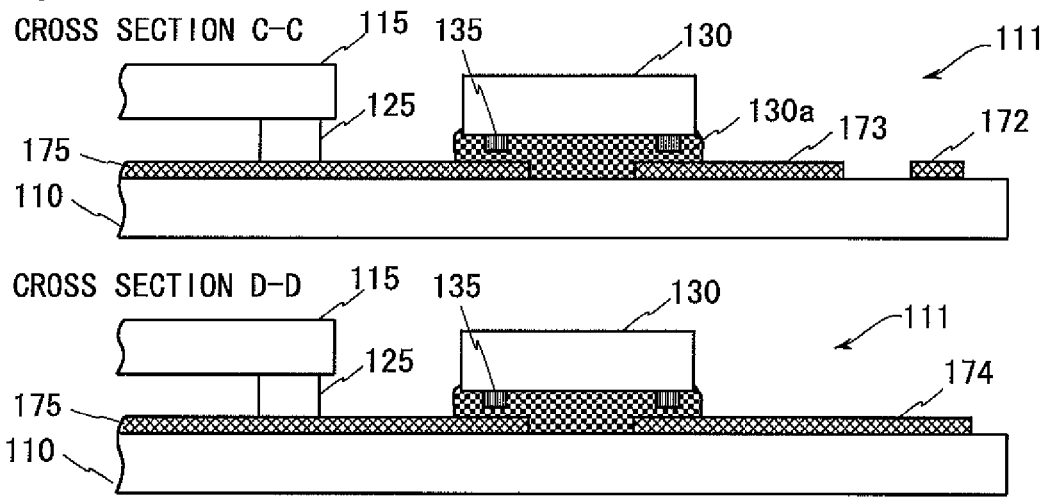
FIGS. 4A to 4C are cross-sectional views showing cross sections of the liquid crystal display device taking along line C-C and line D-D shown in FIG. 3A in a manufacturing process of the liquid crystal display device shown in FIGS. 3A to 3C.
Figure 4B:
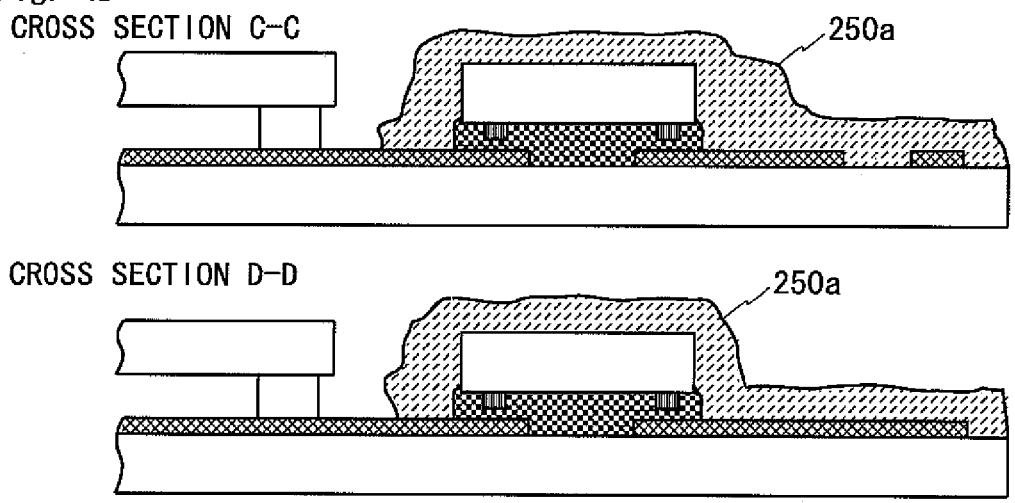
Figure 4C:
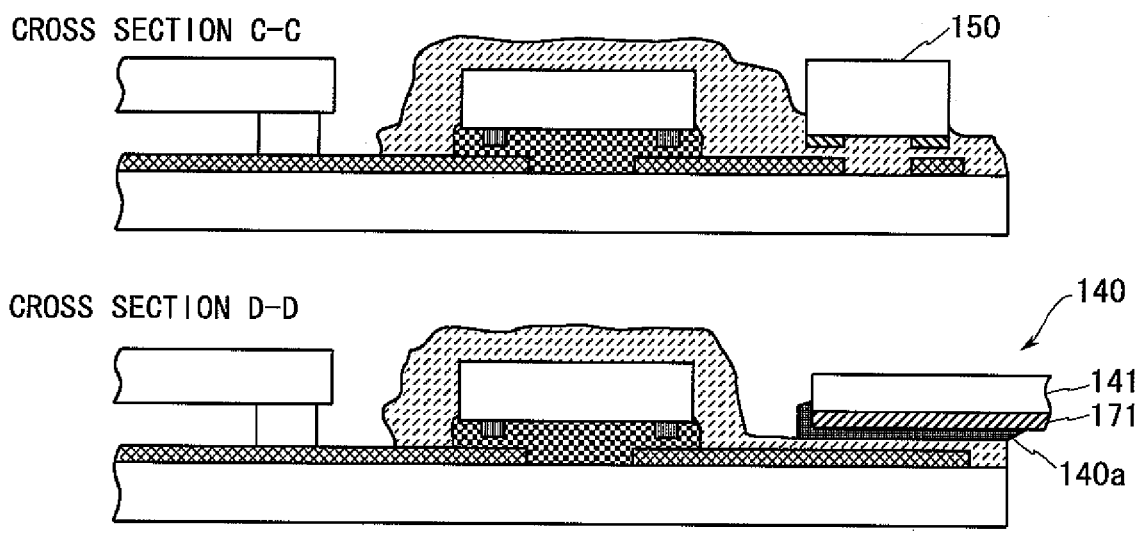

FIGS. 4A to 4C are cross-sectional views showing cross sections of the liquid crystal display device 200 taking along line C-C and line D-D shown in FIG. 3A in a manufacturing process of the liquid crystal display device 200 shown in FIGS. 3A to 3C. In the manufacturing process of the liquid crystal display device 200, the same or corresponding components as/to those in a manufacturing process of the liquid crystal display device 100 according to the first embodiment are denoted by the same reference numerals, and differences from the manufacturing process of the liquid crystal display device 100 will be mainly described.

In the manufacturing process of the liquid crystal display device 200, a step of preparing a glass substrate 110 having formed thereon display traces 175, component traces 173, grounding conductors 172, and FPC traces 174, and a step of mounting an LSI chip 130 on the glass substrate 110, which are shown in FIG. 4A, are the same as those of the manufacturing process of the liquid crystal display device 100 shown in FIG. 2A, and thus, description thereof is omitted. In addition, an another step (not shown) of preparing an FPC board 140 having an FPC ACF 140a adhered thereto is also the same as that of the manufacturing process of the liquid crystal display device 100, and thus, description thereof is omitted.

As shown in FIG. 4B, a single component ACF 250a with a size that covers not only a region where stabilizing capacitors 150 and boost capacitors (not shown) are to be mounted, but also a top surface of the LSI chip 130 mounted first and a region where the FPC board 140 is to be mounted in a step which will be described later, is supplied to a projection 111. Then, the supplied component ACF 250a is adhered to the projection 111. The conditions for adhering the component ACF 250a are, for example, a temperature of 60 to 100° C., a pressure bonding time of 1 to 5 seconds, and a pressure bonding pressure of 0.5 to 2 MPa.

As shown in FIG. 4C, the stabilizing capacitors 150 and the boost capacitors are temporarily placed on the adhered component ACF 250a by a high-speed mounter. At this time, alignment is performed such that one terminals of the stabilizing capacitors 150 are connected to the other ends of the component traces 173 and the other terminals to the grounding conductors 172, respectively, and both terminals of the boost capacitors are connected to the other ends of the different component traces 173, respectively. The conditions for the temporary placement are, for example, a pressure application time of 0.05 to 0.3 seconds and a pressure of 1.0 to 4.0 MPa, and the component ACF 250a is not heated. In addition, the FPC board 140 to which the FPC ACF 140a is adhered in another step is temporarily placed on the component ACF 250a. At this time, alignment is performed such that trace layers 171 on the FPC board 140 are connected to the other ends of the FPC traces 174.

Then, the stabilizing capacitors 150, the boost capacitors, and the FPC board 140 having the FPC ACF 140a adhered thereto which are temporarily placed on the component ACF 250a are simultaneously and permanently pressure bonded to the projection 111. The conditions for the permanent pressure bonding are a temperature of 180 to 200° C., a pressure bonding time of 10 to 20 seconds, and a pressure bonding pressure of 1.0 to 4.0 MPa.

In this manner, the liquid crystal display device 200 is manufactured in which the LSI chip 130 connected by the chip ACF 130a, the FPC board 140 connected by the FPC ACF 140a and the component ACF 250a, and the stabilizing capacitors 150 and the boost capacitors which are connected by the component ACF 250a are mounted on the projection 111.

<3.3 Effects>

The liquid crystal display device 200 according to the second embodiment has the same effects as the liquid crystal display device 100 according to the first embodiment. Furthermore, in the liquid crystal display device 200, since permanent pressure bonding where the FPC board 140 is connected to the FPC traces 174 and permanent pressure bonding where the stabilizing capacitors 150 and the boost capacitors 151 are connected to the component traces 173 and the grounding conductors 172 are simultaneously performed, the manufacturing process of the liquid crystal display device 200 can be shortened.

<4. Third Embodiment>

<4.1 Configuration of A Liquid Crystal Display Device>

Figure 5A:
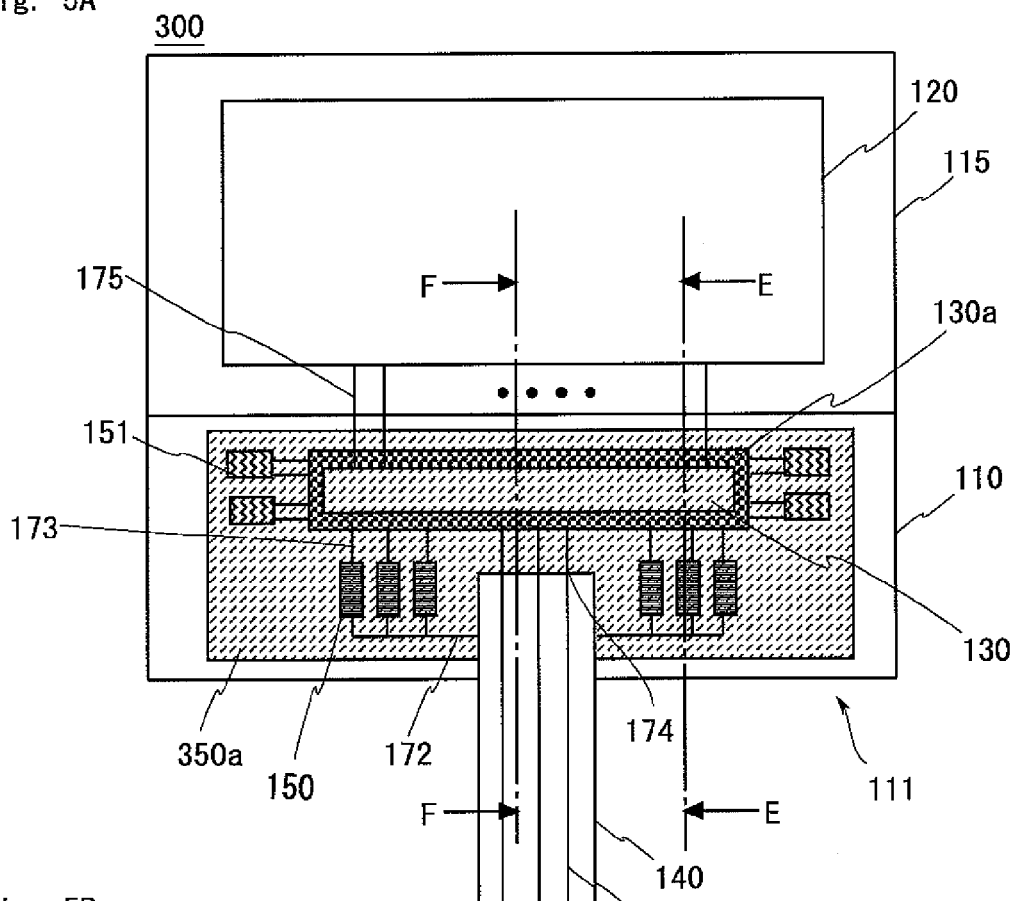
FIG. 5A is a schematic plan view showing a configuration of a liquid crystal display device according to a third embodiment of the present invention.
Figure 5B:
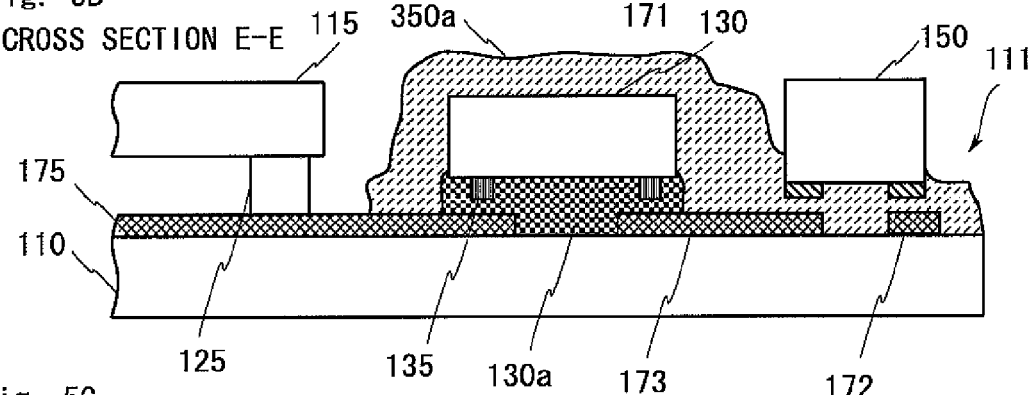
FIG. 5B is a cross-sectional view showing a cross section of the liquid crystal display device taking along line E-E in FIG. 5A.
Figure 5C:
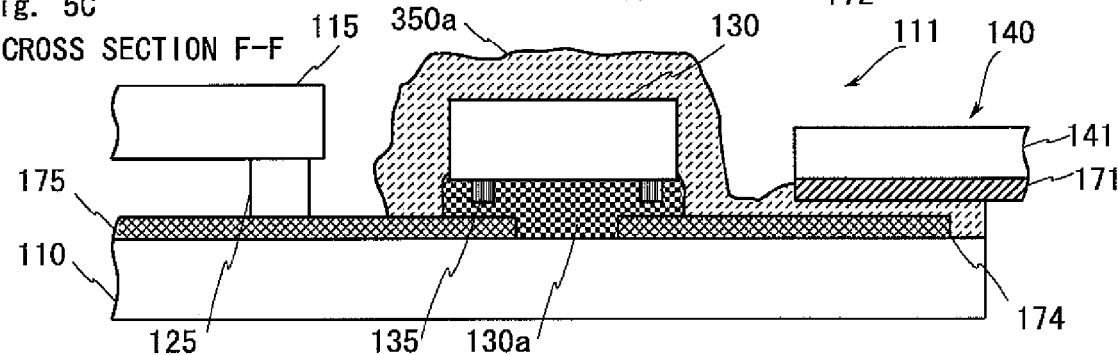
FIG. 5C is a cross-sectional view showing a cross section of the liquid crystal display device taking along line F-F in FIG. 5A.

FIG. 5A is a schematic plan view showing a configuration of a liquid crystal display device 300 according to a third embodiment of the present invention, FIG. 5B is a cross-sectional view showing a cross section of the liquid crystal display device 300 taking along line E-E in FIG. 5A, and FIG. 5C is a cross-sectional view showing a cross section of the liquid crystal display device 300 taking along line F-F in FIG. 5A. As shown in FIGS. 5A to 5C, the liquid crystal display device 300 includes two glass substrates 110 and 115 disposed to face each other, an LSI chip 130, an FPC board 140, six stabilizing capacitors 150, and four boost capacitors 151. In the liquid crystal display device 300, the same or corresponding components as/to those of a liquid crystal display device 100 according to the first embodiment are denoted by the same reference numerals, and differences from the liquid crystal display device 100 will be mainly described.

In the liquid crystal display device 300, a component ACF 350a is made of a single sheet and disposed to cover not only a region in a projection 111 where the stabilizing capacitors 150 and the boost capacitors 151 are to be mounted, but also the top surface of the LSI chip 130 mounted on the projection 111 first, and a region in the projection 111 where the FPC board 140 is to be mounted. As such, in the liquid crystal display device 300, unlike the liquid crystal display device 100, the component ACF 350a is formed in a region in the projection 111 where the FPC board 140 is to be mounted, instead of the top surface of the FPC board 140. Furthermore, the FPC board 140 is disposed on the component ACF 350a with an FPC ACF 140a not being adhered to the FPC board 140. Trace layers 171 on the FPC board 140 are connected to the other ends of FPC traces 174.

As such, unlike the case of the liquid crystal display device 100, the trace layers 171 on the FPC board 140 are connected to the FPC traces 174 using the component ACF 350a, and an FPC ACF 140a is not used. Now, the fact that there is no problem even if the FPC board 140 is mounted on the projection 111 using the component ACF 350a is considered comparing the characteristics of the component ACF 350a with the characteristics of the FPC ACF 140a.

First, the size of conductive particles is considered. Since the terminal pitch of discrete electronic components such as the stabilizing capacitors 150 is larger than the terminal pitch of the trace layers 171 on the FPC board 140, the conductive particles contained in the component ACF 350a are larger than the conductive particles contained in the FPC ACF 140a. However, since the difference in pitch therebetween is small, the conductive particles contained in the component ACF 350a are not of a size that causes a short circuit between adjacent trace layers 171 on the FPC board 140. Hence, even if the FPC board 140 is mounted on the projection 111 using the component ACF 350a, adjacent trace layers 171 on the FPC board 140 are not short-circuited, and thus, the component ACF 350a can be used instead of the FPC ACF 140a. Note that the conductive particles contained in the component ACF 350a may be changed to conductive particles of a size that is the same as or smaller than that of the conductive particles contained in the FPC ACF 140a.

Next, the storage elastic modulus is considered. As described in the basic considerations, even if the component ACF 350a is used to mount the LSI chip 130 on the glass substrate 110 or mount the FPC board 140 on the glass substrate 110, the reliability of a connected portion therebetween can be ensured. Therefore, when considering the storage elastic modulus, the FPC board 140 can be mounted on the glass substrate 110 using the component ACF 350a.

Next, the tack strength is considered. As described in the basic considerations, discrete electronic components such as the stabilizing capacitors 150 are temporarily placed on the component ACF 350a by a high-speed mounter which does not apply high pressure. Thus, the discrete electronic components need to be kept still on the component ACF 350a until they are permanently pressure bonded. Hence, the component ACF 350a requires high tack strength. On the other hand, the FPC board 140 is temporarily placed with higher pressure, and thus, the FPC ACF 140a does not require high tack strength as do the discrete electronic components. However, even if the component ACF 350a having high tack strength is used to connect the FPC board 140, there is no problem. Therefore, when considering the tack strength, the component ACF 350a can be used instead of the FPC ACF 140a.

From the above, it can be seen that when mounting the FPC board 140 on the glass substrate 110, even if only the component ACF 350a is used instead of the FPC ACF 140a, there is no problem.

4.2 Method of Manufacturing the Liquid Crystal Display Device

Figure 6A:
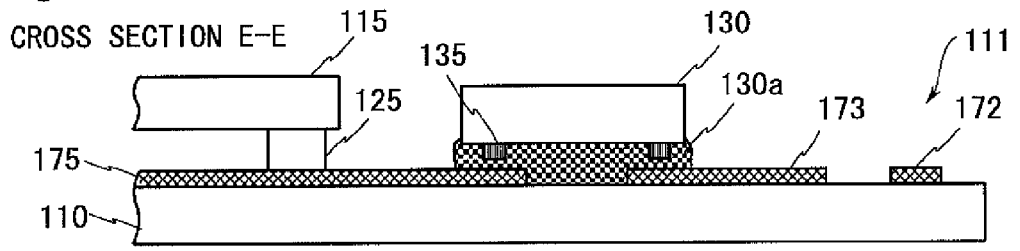
FIGS. 6A to 6C are cross-sectional views showing cross sections of the liquid crystal display device taking along line E-E and line F-F shown in FIG. 5A in a manufacturing process of the liquid crystal display device shown in FIGS. 5A to 5C.
Figure 6A:
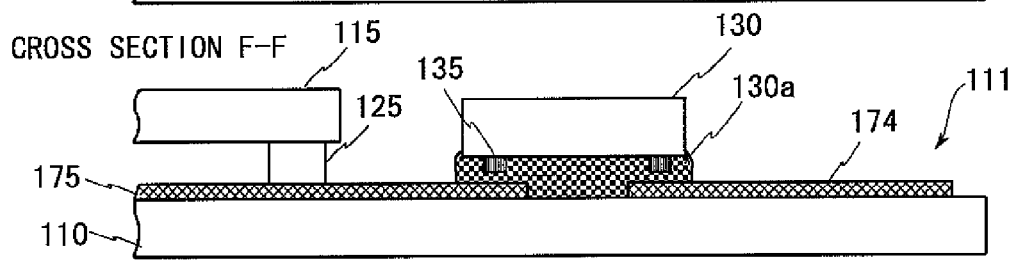
Figure 6B:
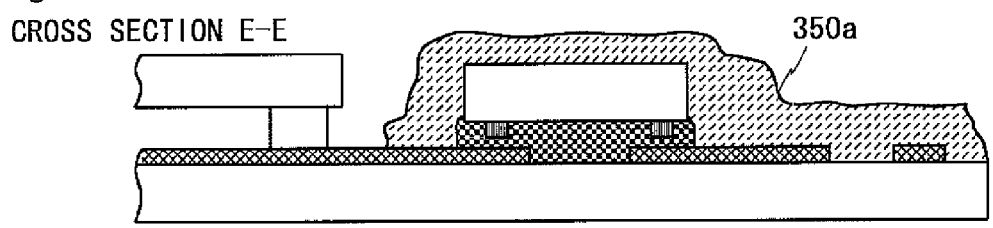
Figure 6B:
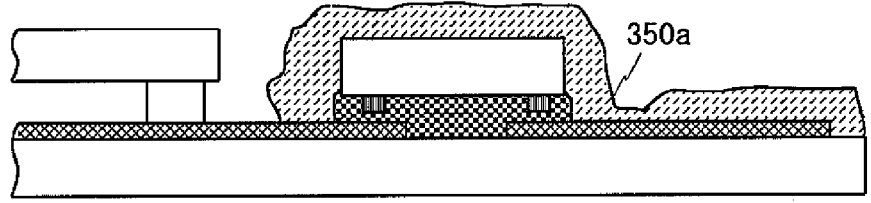
Figure 6C:
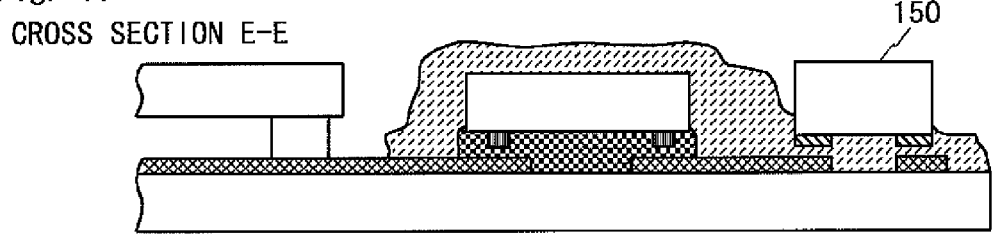
Figure 6C:
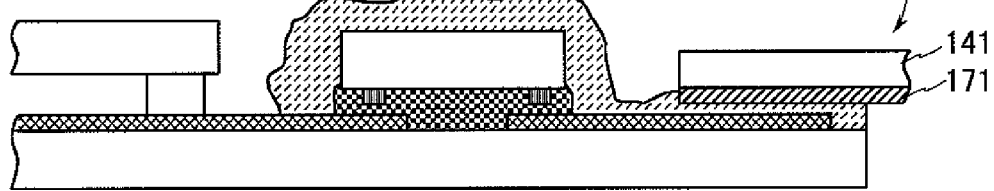

FIGS. 6A to 6C are cross-sectional views showing cross sections of the liquid crystal display device 300 taking along line E-E and line F-F shown in FIG. 5A in a manufacturing process of the liquid crystal display device 300 shown in FIGS. 5A to 5C. In the manufacturing process of the liquid crystal display device 300, the same or corresponding components as/to those in a manufacturing process of the liquid crystal display device 100 according to the first embodiment are denoted by the same reference numerals, and differences from the manufacturing process of the liquid crystal display device 100 will be mainly described.

In the manufacturing process of the liquid crystal display device 300, a step of preparing a glass substrate 110 having formed thereon display traces 175, component traces 173, grounding conductors 172, and FPC traces 174, and a step of mounting an LSI chip 130 on the glass substrate 110, which are shown in FIG. 6A, are the same as those of the manufacturing process of the liquid crystal display device 100 shown in FIG. 2A, and thus, description thereof is omitted.

As shown in FIG. 6B, a single component ACF 350a with a size that covers not only a region where stabilizing capacitors 150 and boost capacitors (not shown) are to be mounted, but also the top surface of the LSI chip 130 mounted first and a region where an FPC board 140 is to be mounted in a step which will be described later, is supplied to a projection 111. Then, the supplied component ACF 350a is adhered to the projection 111. The conditions for adhering the component ACF 350a are, for example, a temperature of 60 to 100° C., a pressure bonding time of 1 to 5 seconds, and a pressure bonding pressure of 0.5 to 2.0 MPa.

As shown in FIG. 6C, the stabilizing capacitors 150 and the boost capacitors are temporarily placed on the adhered component ACF 350a by a high-speed mounter. At this time, alignment is performed such that one terminals of the stabilizing capacitors 150 are connected to the other ends of the component traces 173 and the other terminals to the grounding conductors 172, respectively, and both terminals of the boost capacitors are connected to the other ends of the different component traces 173, respectively. The conditions for the temporary placement are, for example, a pressure application time of 0.05 to 0.3 seconds and a pressure of 1.0 to 4.0 MPa, and the component ACF 350a is not heated. Furthermore, an FPC board 140 is temporarily placed on the component ACF 350a. At this time, alignment is performed such that trace layers 171 on the FPC board 140 are connected to the other ends of the FPC traces 174.

Then, the stabilizing capacitors 150, the boost capacitors 151, and the FPC board 140 which are temporarily placed on the component ACF 350a are simultaneously and permanently pressure bonded to the projection 111 of the glass substrate 110. The conditions for the permanent pressure bonding are, for example, a temperature of 180 to 200° C., a pressure bonding time of 10 to 20 seconds, and a pressure bonding pressure of 1.0 to 4.0 MPa.

In this manner, the liquid crystal display device 300 is manufactured in which the LSI chip 130 connected by a chip ACF 130a, and the FPC board 140, the stabilizing capacitors 150, and the boost capacitors which are connected by the component ACF 350a are mounted on the projection 111.

<4.3 Effects>

The liquid crystal display device 300 according to the third embodiment has the same effects as the liquid crystal display device 100 according to the first embodiment. Furthermore, in the liquid crystal display device 300, since permanent pressure bonding where the trace layers 171 on the FPC board 140 are connected to the FPC traces 174 and permanent pressure bonding where the stabilizing capacitors 150 and the boost capacitors 151 are connected to the component traces 173 are simultaneously performed, the manufacturing process of the liquid crystal display device 300 can be shortened.

Furthermore, since the FPC board 140 is mounted on the glass substrate 110 using the component ACF 350a instead of an FPC ACF 140a, the FPC ACF 140a becomes unnecessary, enabling to reduce the manufacturing cost of the liquid crystal display device 300.

<5. Variants>

Variants common to the above-described first to third embodiments will be described. Note that although the following variants are described as variants of the first embodiment for description reasons, the variants can also be similarly applied to the other embodiments.

<5.1 First Variant>

In a liquid crystal display device 100 according to the first embodiment, a component ACF 150a supplied to a projection 111 has a size that covers not only a region where discrete electronic components such as stabilizing capacitors 150 are to be mounted, but also the top surfaces of an LSI chip 130 and an FPC board 140 which are mounted first. However, if the component ACF 150a adhered to the top surface of the LSI chip 130 is present, then when the liquid crystal display device 100 operates, heat generated from the LSI chip 130 is not sufficiently dissipated. Hence, after the component ACF 150a is adhered, a portion of the component ACF 150a covering the top surface of the LSI chip 130 may be removed.

Figure 7A:
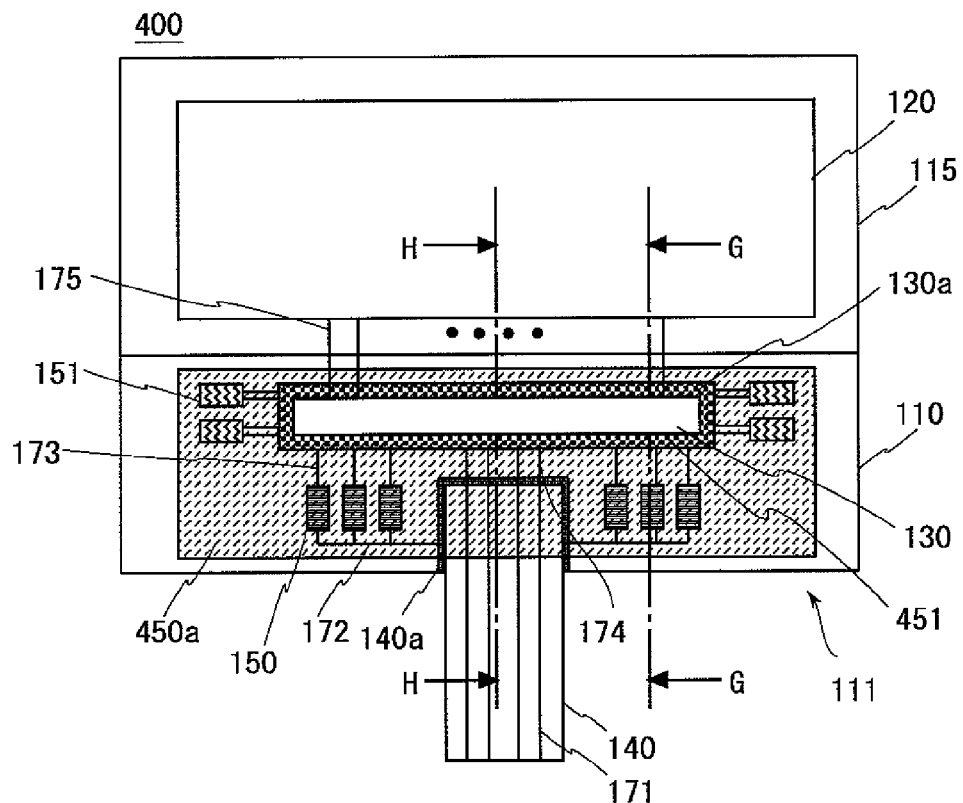
FIG. 7A is a schematic plan view showing a configuration of a liquid crystal display device according to a first variant.
Figure 7B:
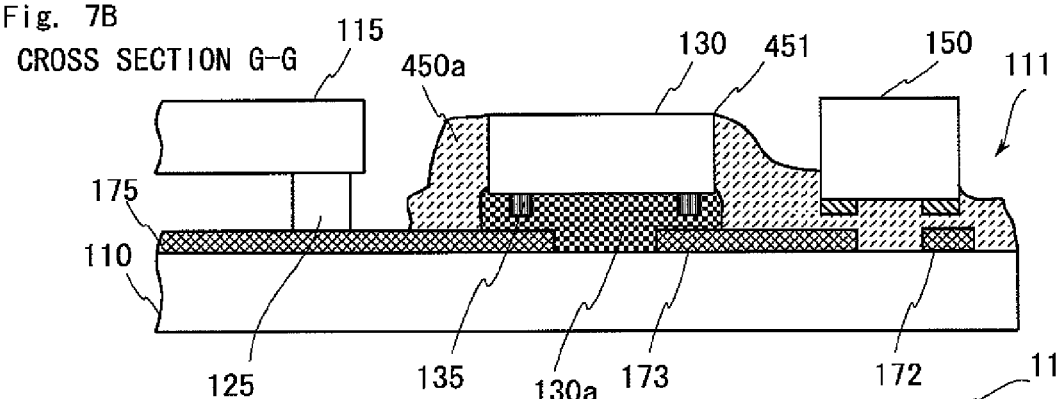
FIG. 7B is a cross-sectional view showing a cross section of the liquid crystal display device taking along line G-G in FIG. 7A.
Figure 7C:
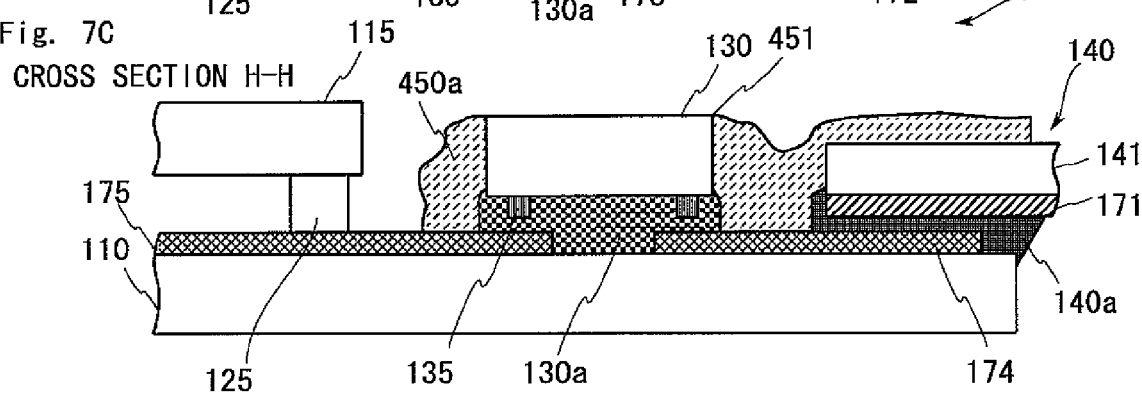
FIG. 7C is a cross-sectional view showing a cross section of the liquid crystal display device taking along line H-H in FIG. 7A.

FIG. 7A is a schematic plan view showing a configuration of a liquid crystal display device 400 according to a first variant, FIG. 7B is a cross-sectional view showing a cross section of the liquid crystal display device 400 taking along line G-G in FIG. 7A, and FIG. 7C is a cross-sectional view showing a cross section of the liquid crystal display device 400 taking along line H-H in FIG. 7A. As shown in FIGS. 7A to 7C, the liquid crystal display device 400 includes two glass substrates 110 and 115 disposed to face each other, an LSI chip 130, an FPC board 140, six stabilizing capacitors 150, and four boost capacitors 151. In the liquid crystal display device 400, the same or corresponding components as/to those of the liquid crystal display device 100 according to the first embodiment are denoted by the same reference numerals, and a difference from the liquid crystal display device 100 will be mainly described.

As shown in FIGS. 7A to 7C, in the liquid crystal display device 400, unlike the liquid crystal display device 100, an opening 451 is formed in a portion of a component ACF 450a corresponding to the top surface of the LSI chip 130, and thus, the top surface of the LSI chip 130 is exposed.

Figure 8A:
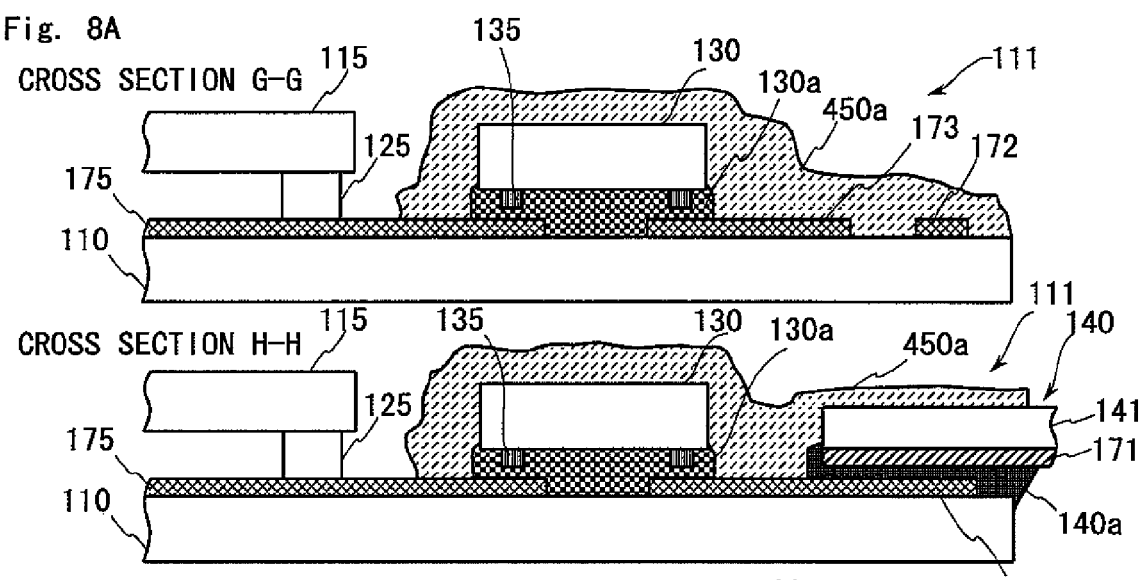
FIGS. 8A to 8C are cross-sectional views showing cross sections of the liquid crystal display device taking along line G-G and line H-H shown in FIG. 7A in a manufacturing process of the liquid crystal display device shown in FIGS. 7A to 7C.
Figure 8B:
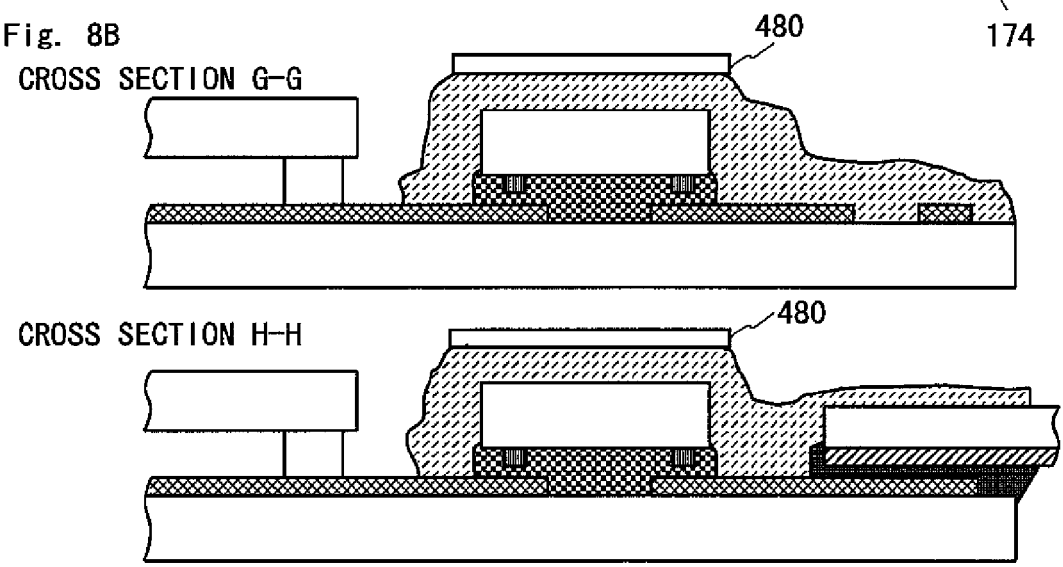
Figure 8C:
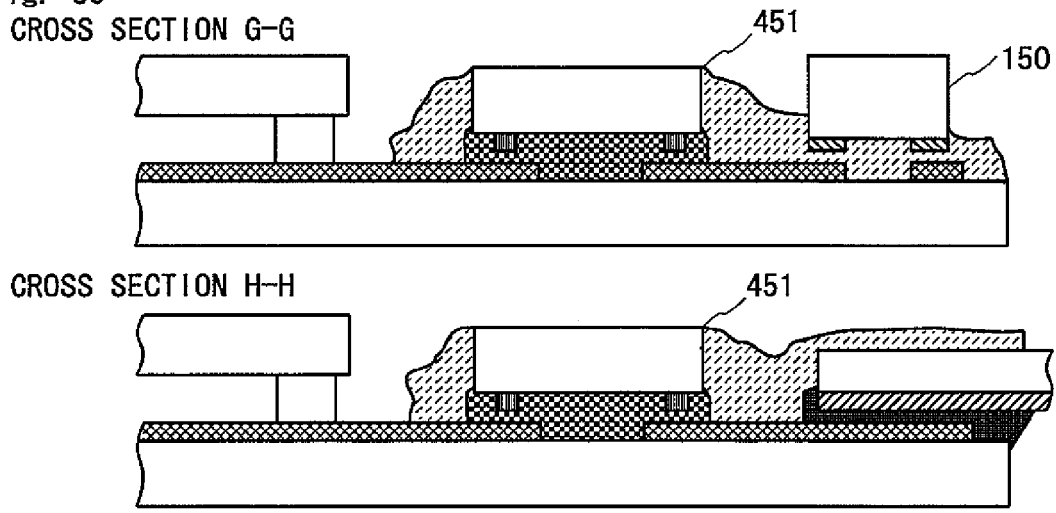
Figure 9:
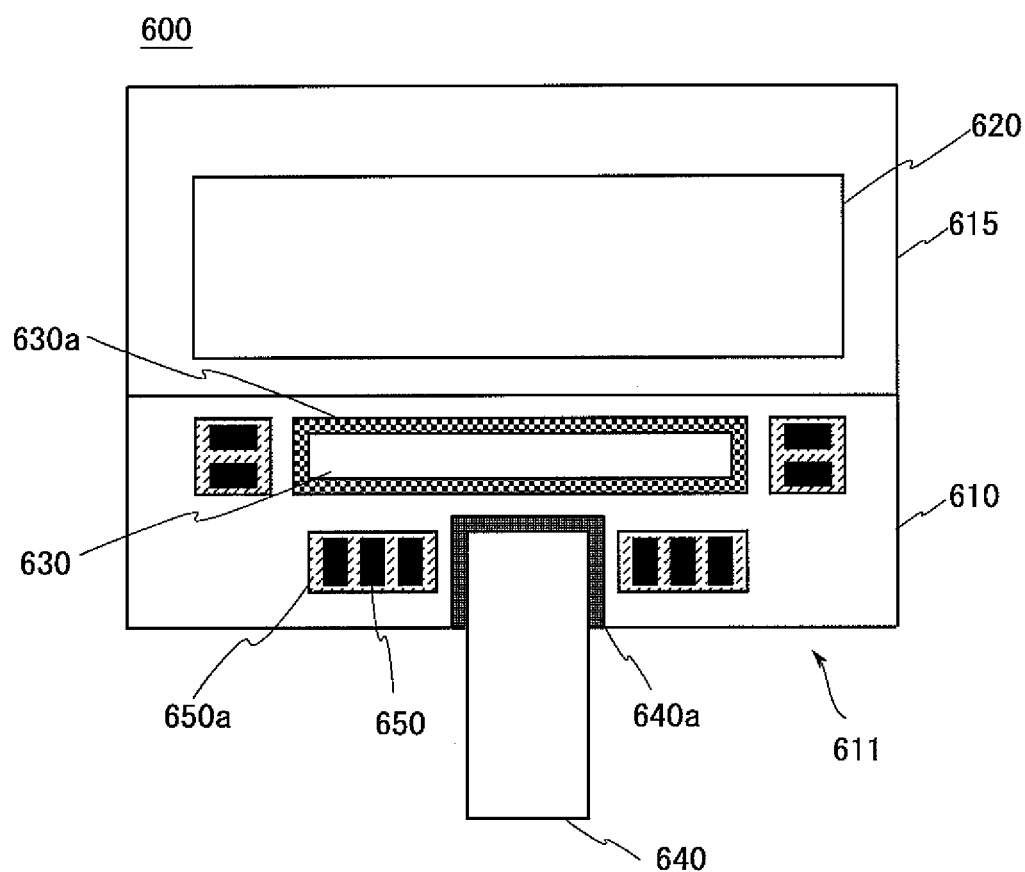
FIG. 9 is a schematic plan view of a conventional liquid crystal display device.

In addition, FIGS. 8A to 8C are cross-sectional views showing cross sections of the liquid crystal display device 400 taking along line G-G and line H-H shown in FIG. 7A in a manufacturing process of the liquid crystal display device 400 shown in FIGS. 7A to 7C.

In a manufacturing process for the liquid crystal display device 400, a step of preparing a glass substrate 110, a step of mounting an LSI chip 130, a step of mounting an FPC board 140, and a step of adhering a component ACF 450a to the top surfaces of the LSI chip 130 and the FPC board 140 and to a region where stabilizing capacitors 150 and boost capacitors (not shown) are to be mounted, which are shown in FIG. 8A, are the same as those shown in FIGS. 2A and 2B, and thus, description of those steps is omitted.

As shown in FIG. 8B, an adhesive tape 480 is pressure bonded to a surface of a portion of the component ACF 450a adhered to a projection 111, the top surface of the LSI chip 130, and the top surface of the FPC board 140 that covers the top surface of the LSI chip 130.

When the pressure-bonded adhesive tape 480 is peeled, as shown in FIG. 8C, the portion of the component ACF 450a adhered to the top surface of the LSI chip 130 is peeled together with the adhesive tape 480. As a result, an opening 451 is formed in the component ACF 450a, whereby the top surface of the LSI chip 130 is exposed. A step of temporarily placing the stabilizing capacitors 150 and the boost capacitors on the component ACF 450a and a step of permanently pressure bonding the temporarily placed stabilizing capacitors 150 and boost capacitors onto the component ACF 450a are the same as those shown in FIG. 2C, and thus, description thereof is omitted.

As such, since the opening 451 from which the top surface of the LSI chip 130 is exposed is formed in the component ACF 450a, the heat dissipation efficiency of the LSI chip 130 can be improved. In addition, when a bezel (not shown) is placed on the entire liquid crystal display device 400 except a display portion 120, after mounting the LSI chip 130, the FPC board 140, the stabilizing capacitors 150, etc., on the projection 111, since a portion of the component ACF 450a that is higher in height than the glass substrate 115 is removed, a portion of the component ACF 450a on the LSI chip 130 can be prevented from coming into contact with the bezel. Note that although in this variant the opening 451 is formed in a portion of the component ACF 450a provided on the top surface of the LSI chip 130, an opening portion may be further provided in a portion of the component ACF 450a provided on the top surface of the FPC board 140.

<5.2 Second Variant>

In a liquid crystal display device 100 according to the first embodiment, discrete electronic components mounted on a projection 111 are described as chip capacitors. However, the discrete electronic components mounted on the projection 111 are not limited to chip capacitors, and may be other passive components such as chip resistors and chip coils. Alternatively, the discrete electronic components may be active components such as light-emitting diodes (LEDs), diodes, discrete transistors, and an LSI chip having various functions. Discrete electronic components as used herein include such passive components and active components.

In addition, an LSI chip 130 mounted on the liquid crystal display device 100 is a bare chip (a chip before packaging) and is face-down bonded to the projection 111. In this case, the mounting area of the LSI chip 130 can be reduced, and thus, the area of a glass substrate 110 can be reduced. However, an LSI device in which the LSI chip 130 is packaged in a surface mounted package may be mounted on the projection 111.

<5.3 Third Variant>

Although a liquid crystal display device is described in the first embodiment, the application is not limited to a liquid crystal display device, and the invention can also be similarly applied to various types of display devices including organic or inorganic EL (Electro Luminescence) displays, Plasma Display Panels (PDPs), vacuum fluorescent displays, and electronic papers.

<5.4 Fourth Variant>

In the first embodiment, a liquid crystal display device is described in which an LSI chip 130, an FPC board 140, and discrete electronic components are mounted on a projection 111 of a glass substrate 110. However, the application of the present invention is not limited to display devices such as liquid crystal display devices 100 to 400, and the present invention may be applied to a board module having an LSI chip 130, an FPC board 140, and discrete electronic components mounted on a substrate. In addition, the present invention is not only applied to the case of mounting on a rigid substrate such as the glass substrate 110, but also similarly applied to the case of mounting on a flexible substrate made of an insulating film.

Industrial Applicability

A board module of the present invention is miniaturized by mounting a plurality of electronic components using their appropriate ACFs. Thus, the board module of the present invention is used as a board contained in electronic devices in which miniaturization is strongly sought. For example, the board module is used as a board having mounted thereon electronic components that drive a display portion of a portable terminal.

Description of Reference Numerals

100, 200, 300, and 400: LIQUID CRYSTAL DISPLAY DEVICE
    100 and 115: GLASS SUBSTRATE
    111: PROJECTION
    120: DISPLAY PORTION
    130: LSI CHIP
    130a: CHIP ACF
    135: BUMP ELECTRODE
    140: FPC BOARD
    140a: FPC ACF
    150: STABILIZING CAPACITOR
    150a, 250a, 350a, and 450a: COMPONENT ACF
    151: BOOST CAPACITOR
    451: OPENING
    480: ADHESIVE TAPE

The invention claimed is:

1. A board module having a plurality of electronic components mounted on a substrate by anisotropic conductive adhesives, the board module comprising:
    a plurality of regions arranged on a surface of the substrate including a first, a second, and a third region;
    anisotropic conductive adhesives including first, second, and third anisotropic conductive adhesives having different characteristics from one another;
    the plurality of electronic components including a first electronic component mounted on the first region by the first anisotropic conductive adhesive, a second electronic component mounted on the second region by the second anisotropic conductive adhesive, and a third electronic component mounted on the third region by the third anisotropic conductive adhesive; wherein the third anisotropic conductive adhesive is integrally provided by a single monolithic body and is provided on at least a surface of the first electronic component, on a top surface of the second electronic component, and on the third region.

2. The board module according to claim 1, wherein
the third anisotropic conductive adhesive covers at least a top surface of the first electronic component, the second region, and the third region, and
the second electronic component and the third electronic component are mounted in the second region and the third region, respectively, by the third anisotropic conductive adhesive.

3. The board module according to claim 2, further comprising a second anisotropic conductive adhesive adhered to the second electronic component, wherein
the second electronic component is mounted in the second region by the second anisotropic conductive adhesive and the third anisotropic conductive adhesive.

4. The board module according to claim 1, wherein
a Young's modulus of the first electronic component is higher than a Young's modulus of the second electronic component,
a storage elastic modulus of the first anisotropic conductive adhesive is higher than or equal to a storage elastic modulus of the second anisotropic conductive adhesive, and
tack strength of the first anisotropic conductive adhesive is lower than tack strength of the second anisotropic conductive adhesive.

5. The board module according to claim 4, wherein
the substrate is a rigid substrate, and
the storage elastic modulus of the first anisotropic conductive adhesive is 1.5 to 2.0 GPa, and the storage elastic modulus of the second anisotropic conductive adhesive is 1.2 to 1.3 GPa.

6. The board module according to claim 4, wherein a size of conductive particles respectively contained in the first, second, and third anisotropic conductive adhesives increases in order of the first, second, and third anisotropic conductive adhesives, and a pitch of terminals respectively provided on the first, second, and third electronic components increases in order of the first, second, and third electronic components.

7. The board module according to claim 1, wherein
a Young's modulus of the first electronic component is higher than a Young's modulus of the third electronic component,
a storage elastic modulus of the first anisotropic conductive adhesive is higher than or equal to a storage elastic modulus of the third anisotropic conductive adhesive, and
tack strength of the third anisotropic conductive adhesive is higher than tack strength of the first anisotropic conductive adhesive.

8. The board module according to claim 7, wherein conductive particles contained in the third anisotropic conductive adhesive are larger than conductive particles contained in the first anisotropic conductive adhesive, and a pitch of terminals provided on the third electronic component is larger than a pitch of terminals provided on the first electronic component.

9. The board module according to claim 1, wherein the third anisotropic conductive adhesive has an opening at least in a portion thereof corresponding to a top surface of the first electronic component.

10. The board module according to claim 1, wherein
the substrate is a rigid substrate having a trace formed on a surface thereof,
the first electronic component is a semiconductor chip having a bump electrode formed on a surface of a semiconductor substrate, and
the semiconductor chip is mounted by connecting the bump electrode to the trace on the rigid substrate.

11. The board module according to claim 1, wherein
the substrate is a flexible substrate having a trace formed on a surface thereof,
the first electronic component is a semiconductor chip having a bump electrode formed on a surface of a semiconductor substrate, and
the semiconductor chip is mounted by connecting the bump electrode to the trace on the flexible substrate.

12. The board module according to claim 1, wherein
the first electronic component is a semiconductor element formed on a semiconductor substrate,
the second electronic component is a flexible printed circuit board, and
the third electronic component is a discrete electronic component.

13. A display device comprising the board module according to claim 12, wherein
the board module further includes a display portion formed on the substrate, and
the semiconductor element is a drive element that drives the display portion based on a signal provided from an external source through the flexible printed circuit board.

* * * * *